(12) United States Patent
Badehi

(10) Patent No.: US 7,144,745 B2
(45) Date of Patent: Dec. 5, 2006

(54) METHODS FOR PRODUCING PACKAGED INTEGRATED CIRCUIT DEVICES AND PACKAGED INTEGRATED CIRCUIT DEVICES PRODUCED

(75) Inventor: Avner Pierre Badehi, Harei Yehuda (IL)

(73) Assignee: Tessera Technologies Hungary Kft. (HU)

( * ) Notice: Subject to any disclaimer, the term of this patent is extended or adjusted under 35 U.S.C. 154(b) by 0 days.

(21) Appl. No.: 09/922,770

(22) Filed: Aug. 7, 2001

(65) Prior Publication Data

US 2002/0027296 A1 Mar. 7, 2002

Related U.S. Application Data

(62) Division of application No. 09/725,166, filed on Nov. 29, 2000.

(30) Foreign Application Priority Data

Dec. 12, 1999 (IL) .................................... 133453

(51) Int. Cl.
H01L 21/00 (2006.01)
H01L 21/44 (2006.01)
(52) U.S. Cl. .............................. 438/7; 438/51; 438/116
(58) Field of Classification Search .................. 438/7, 438/51, 116
See application file for complete search history.

(56) References Cited

U.S. PATENT DOCUMENTS

| 2,507,956 | A | 5/1950 | Bruno et al. |
| 2,796,370 | A | 6/1957 | Ostrander et al. |
| 2,851,385 | A | 9/1958 | Spruance, Jr. et al. |
| 4,633,573 | A | 1/1987 | Scherer |
| 4,894,707 | A * | 1/1990 | Yamawaki et al. ........... 357/74 |
| 4,908,086 | A | 3/1990 | Goodrich et al. |
| 4,943,844 | A | 7/1990 | Oscilowski et al. |
| 5,037,779 | A | 8/1991 | Whalley et al. |
| 5,455,386 | A | 10/1995 | Brathwaite et al. |
| 5,455,455 | A | 10/1995 | Badehi |
| 5,505,985 | A | 4/1996 | Nakamura et al. |
| 5,547,906 | A | 8/1996 | Badehi |
| 5,610,431 | A | 3/1997 | Martin |
| 5,660,741 | A | 8/1997 | Suzuki et al. |
| 5,716,759 | A | 2/1998 | Badehi |
| 5,719,979 | A | 2/1998 | Furuyama |
| 5,824,204 | A | 10/1998 | Jerman |
| 5,837,562 | A | 11/1998 | Cho |
| 5,915,168 | A * | 6/1999 | Salatino et al. ............. 438/110 |
| 5,925,973 | A | 7/1999 | Eda et al. |
| 5,969,461 | A | 10/1999 | Anderson et al. |
| 5,980,663 | A | 11/1999 | Badehi |
| 5,981,945 | A | 11/1999 | Spaeth et al. |

(Continued)

FOREIGN PATENT DOCUMENTS

JP 11-326366 11/1999

(Continued)

OTHER PUBLICATIONS

Nanu® SU-8 Features & Benefits, Micro Chem Corp, Newton, Mass., rev. May 1998, one page.

(Continued)

Primary Examiner—David S. Blum
(74) Attorney, Agent, or Firm—Lerner,David,Littenberg,Krumholz & Mentlik, LLP

(57) ABSTRACT

A method of producing a crystalline substrate based device includes forming a microstructure on a crystalline substrate. At least one packaging layer is sealed over the microstructure by an adhesive and defines therewith at least one gap between the crystalline substrate and the at least one packaging layer.

42 Claims, 18 Drawing Sheets

U.S. PATENT DOCUMENTS

| | | | |
|---|---|---|---|
| 5,996,199 A * | 12/1999 | Ichikawa et al. | 29/25.35 |
| 6,083,766 A * | 7/2000 | Chen | 438/15 |
| 6,087,586 A | 7/2000 | Chen | |
| 6,106,735 A | 8/2000 | Kurle et al. | |
| 6,111,274 A | 8/2000 | Arai | |
| 6,168,965 B1 | 1/2001 | Malinovich et al. | |
| 6,214,644 B1 | 4/2001 | Glenn | |
| 6,215,642 B1 | 4/2001 | Sogard | |
| 6,245,595 B1 * | 6/2001 | Nguyen et al. | 438/108 |
| 6,265,763 B1 | 7/2001 | Jao et al. | |
| 6,268,231 B1 * | 7/2001 | Wetzel | 438/48 |
| 6,507,097 B1 | 1/2003 | Goetz et al. | |
| 6,548,911 B1 | 4/2003 | Yu et al. | |
| 6,768,190 B1 | 7/2004 | Yang et al. | |

FOREIGN PATENT DOCUMENTS

| | | |
|---|---|---|
| WO | WO-95/19645 | 7/1995 |
| WO | WO 95/19645 | 7/1995 |
| WO | WO 97/45955 | 12/1997 |
| WO | WO-99/040624 | 8/1999 |

OTHER PUBLICATIONS

Nanu® SU-8 Resists & Specifications, Micro Chem Corp, Newton, Mass., rev. May 1998, 2 pages.

EPO-TEK® 353ND BOND 1 Specifications, Epoxy Technology Inc., Billerica, Mass., rev. Jul. 1993, one page.

* cited by examiner

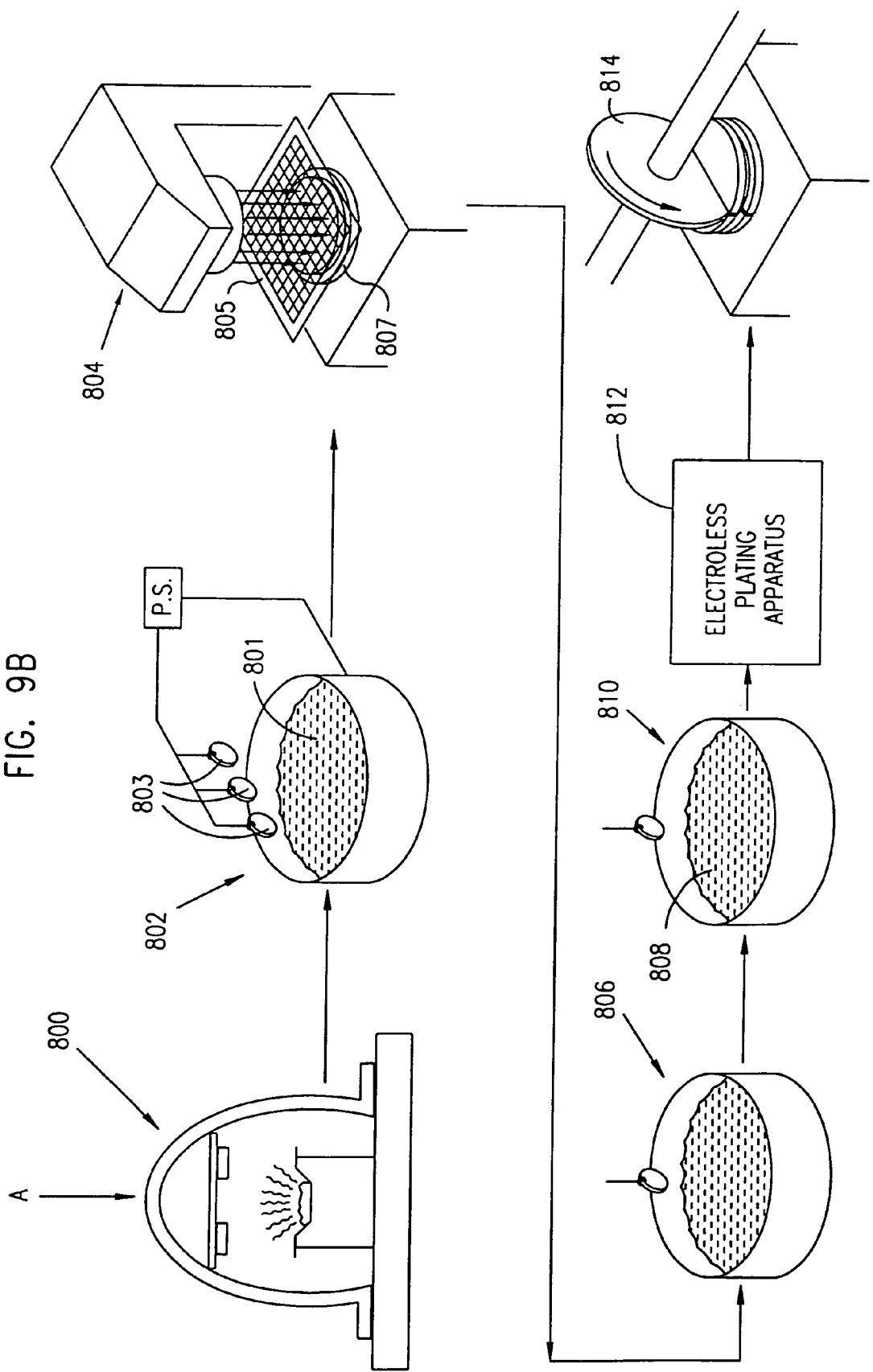

METHODS FOR PRODUCING PACKAGED INTEGRATED CIRCUIT DEVICES AND PACKAGED INTEGRATED CIRCUIT DEVICES PRODUCED

CROSS REFERENCE TO RELATED APPLICATION

This application is a divisional of U.S. patent application Ser. No. 09/725,166, filed on Nov. 29, 2000 in the name of Avner Pierre Badehi and entitled Method of Producing Package Integrated Circuit Devices and Package Integrated Circuit Devices Produced Thereby, the subject matter of which is hereby incorporated by reference.

FIELD OF THE INVENTION

The present invention relates to integrated circuits and similar devices generally and to methods for the manufacture thereof.

BACKGROUND OF THE INVENTION

An essential step in the manufacture of all integrated circuit devices is known as "packaging" and involves mechanical and environmental protection of a silicon chip which is at the heart of the integrated circuit as well as electrical interconnection between predetermined locations on the silicon chip and external electrical terminals.

At present three principal technologies are employed for packaging semiconductors: wire bonding, tape automatic bonding (TAB) and flip chip.

Wire bonding employs heat and ultrasonic energy to weld gold bonding wires between bond pads on the chip and contacts on the package.

Tape automatic bonding (TAB) employs a copper foil tape instead of bonding wire. The copper foil tape is configured for each specific die and package combination and includes a pattern of copper traces suited thereto. The individual leads may be connected individually or as a group to the various bond pads on the chip.

Flip chips are integrated circuit dies which have solder bumps formed on top of the bonding pads, thus allowing the die to be "flipped" circuit side down and directly soldered to a substrate. Wire bonds are not required and considerable savings in package spacing may be realized.

The above-described technologies each have certain limitations. Both wire bonding and TAB bonding are prone to bad bond formation and subject the die to relatively high temperatures and mechanical pressures. Both wire bond and TAB technologies are problematic from a package size viewpoint, producing integrated circuit devices having a die-to-package area ratio ranging from about 10% to 60%.

The flip-chip does not provide packaging but rather only interconnection. The interconnection encounters problems of uniformity in the solder bumps as well as in thermal expansion mismatching, which limits the use of available substrates to silicon or materials which have thermal expansion characteristics similar to those of silicon.

The patent literature is extremely rich in the area of integrated circuits and methods for the manufacture thereof. Described in applicant's published PCT Application WO 95/19645 are methods and apparatus for producing integrated circuit devices.

The following U.S. Patents and patent applications of the present inventor are considered to be particularly relevant: U.S. Pat. Nos. 5,716,759; 5,547,906; 5,455,455 and Ser. No. 08/952,019.

SUMMARY OF THE INVENTION

The present invention seeks to provide improved packaged crystalline substrate based devices and methods for producing same.

There is thus provided in accordance with a preferred embodiment of the present invention a crystalline substrate based device including a crystalline substrate having formed thereon a microstructure and at least one packaging layer which is sealed over the microstructure by an adhesive and defines therewith at least one gap between the crystalline substrate and the at least one packaging layer.

There is also provided in accordance with a preferred embodiment of the present invention a chip scale packaged crystalline substrate including:

a substrate having formed thereon a microstructure; and at least one chip scale package which is sealed over the microstructure and defines therewith at least one gap.

There is additionally provided in accordance with a preferred embodiment of the present invention a method of producing a crystalline substrate based device including:

providing a microstructure on a substrate; and adhesively sealing at least one packaging layer over the microstructure and at least partially spaced therefrom, thereby to define a gap between the microstructure and the at least one packaging layer.

Preferably, at least one packaging layer is sealed onto the crystalline substrate using an adhesive, such as epoxy.

In accordance with a preferred embodiment of the present invention, the crystalline substrate includes silicon, lithium niobate, lithium tantalate or quartz.

Preferably, the at least one packaging layer is transparent.

The at least one cavity may include a single cavity or a plurality of cavities.

The microstructure may include a micromechanical structure, a microelectronic structure and/or an optoelectronic structure.

BRIEF DESCRIPTION OF THE DRAWING

FIGS. 9A and 9B are illustrations of apparatus typically employed in the manufacture of a crystalline substrate based devices of the type shown in FIG. 2B in the manner shown in FIGS. 6A–6K.

DETAILED DESCRIPTION OF PREFERRED EMBODIMENTS

Figure 1A:
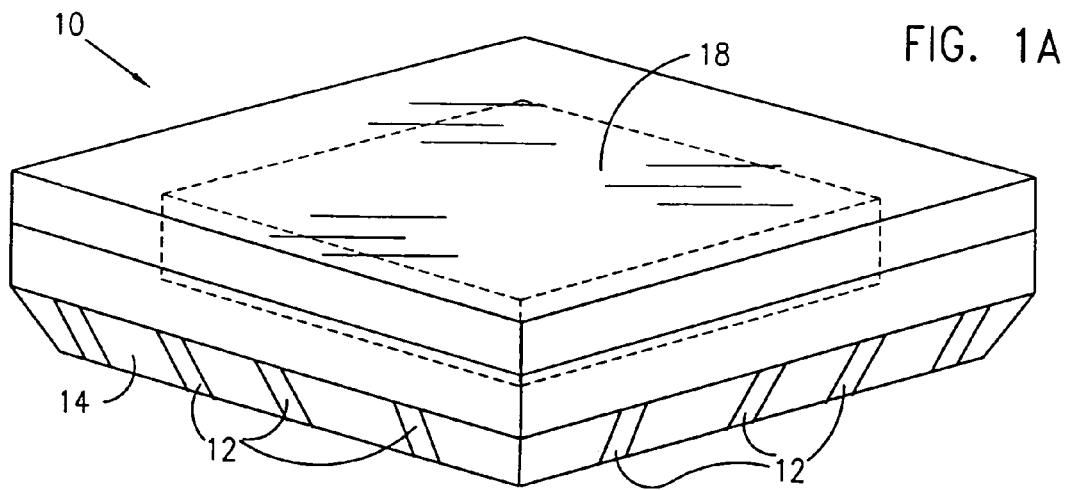
FIGS. 1A and 1B are pictorial illustrations of a crystalline substrate based device having an internal cavity, constructed and operative in accordance with a preferred embodiment of the present invention.
Figure 1B:
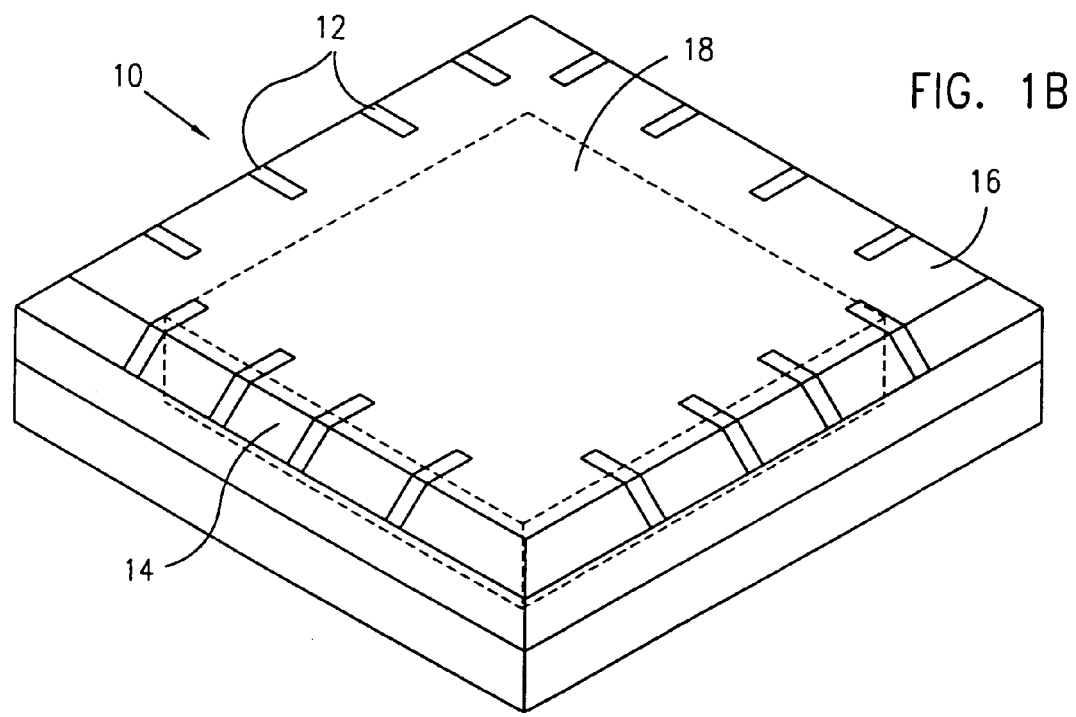

Reference is now made to FIGS. 1A and 1B, which together illustrate a preferred embodiment of integrated circuit device constructed and operative in accordance with a preferred embodiment of the present invention. The integrated circuit device includes a relatively thin and compact, environmentally protected and mechanically strengthened integrated circuit package 10 having a multiplicity of electrical contacts 12 plated along the edge surfaces 14 thereof.

Preferably, contacts 12 extend over edge surfaces onto the planar surfaces 16 of the package. This contact arrangement permits both flat surface mounting and edge mounting of package 10 onto a circuit board. It is noted that the integrated circuit package 10 may include one or more of the following elements (not shown): an integrally formed dichroic filter, color filter, antireflective coating, polarizer, optical grating, integrated wave guide and optical coupling bumps.

In accordance with a preferred embodiment of the present invention, the integrated circuit package 10 defines a cavity 18, which is indicated in phantom lines.

Reference is now made to FIGS. 2A–2D, which illustrate four alternative preferred embodiments of integrated circuit devices of the general type shown in FIGS. 1A & 1B, constructed and operative in accordance with another preferred embodiment of the present invention. Each of the devices shown in FIGS. 2A–2D includes a relatively thin and compact, environmentally protected and mechanically strengthened integrated circuit package having a multiplicity of electrical contacts plated along the edge surfaces thereof.

Figure 2A:
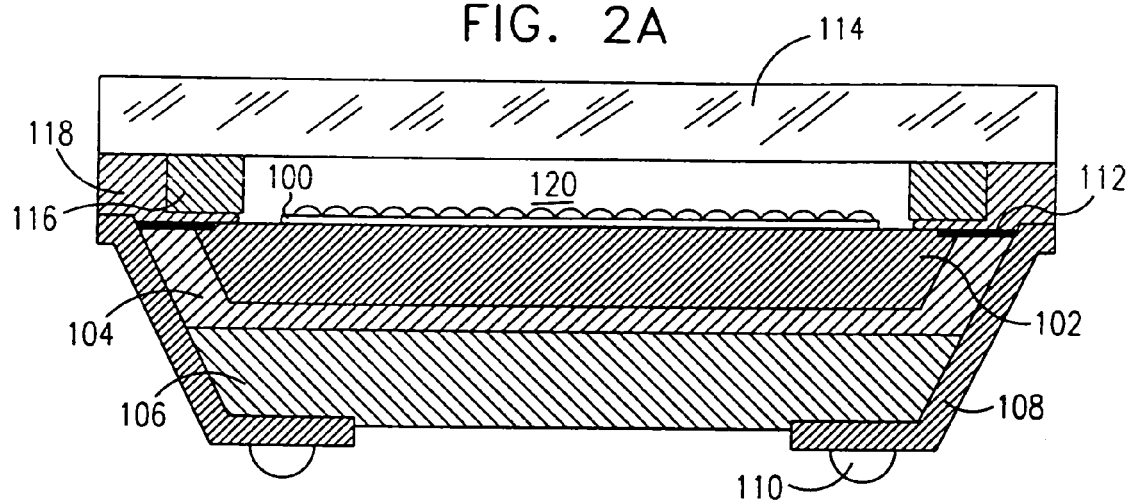
FIGS. 2A, 2B, 2C & 2D are simplified sectional illustrations of various crystalline substrate based devices constructed and operative in accordance with a preferred embodiment of the present invention, corresponding generally to FIGS. 1A and 1B.

FIG. 2A shows an integrated circuit device including a microlens array 100 formed on a crystalline substrate 102. Underlying the substrate 102 and sealed thereto by epoxy 104 is a packaging layer 106, typically formed of glass, along edges of which are formed electrical contacts 108, typically defining bumps 110. Conductive pads 112 preferably connect substrate 102 to electrical contacts 108.

In accordance with a preferred embodiment of the present invention a packaging layer 114, typically formed of glass, and associated spacer elements 116, are sealed, by means of an adhesive such as epoxy 118, over substrate 102 so as to define a cavity 120 between the microlens array 100 and layer 114.

It is appreciated that packaging layer 114 is preferably transparent and may have formed thereon a dichroic filter and/or anti-reflective coating.

Figure 2B:
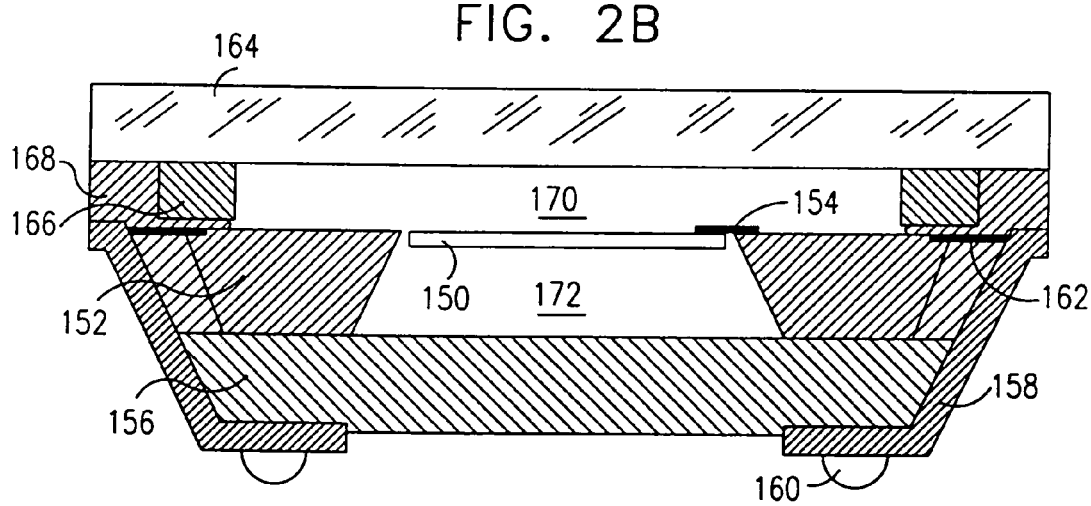

FIG. 2B shows an integrated circuit device including an optoelectronic or electromechanical device 150, such as a chemical sensor, a micromirror array or an accelerometer is suspended on a crystalline substrate 152, as by an electrically conductive connector 154. Sealed onto substrate 152 is a packaging layer 156 typically formed of glass, along edges of which are formed electrical contacts 158, typically defining bumps 160. Conductive pads 162 preferably connect substrate 152 to electrical contacts 158.

In accordance with a preferred embodiment of the present invention a packaging layer 164, typically formed of glass, and associated spacer elements 166, are sealed, by means of an adhesive, such as epoxy 168, over substrate 152 so as to define first and second cavities 170 and 172 between the device 150 and both layer 164 and layer 156.

It is appreciated that packaging layer 164 is preferably transparent and may have formed thereon a dichroic filter and/or anti-reflective coating.

Figure 2C:
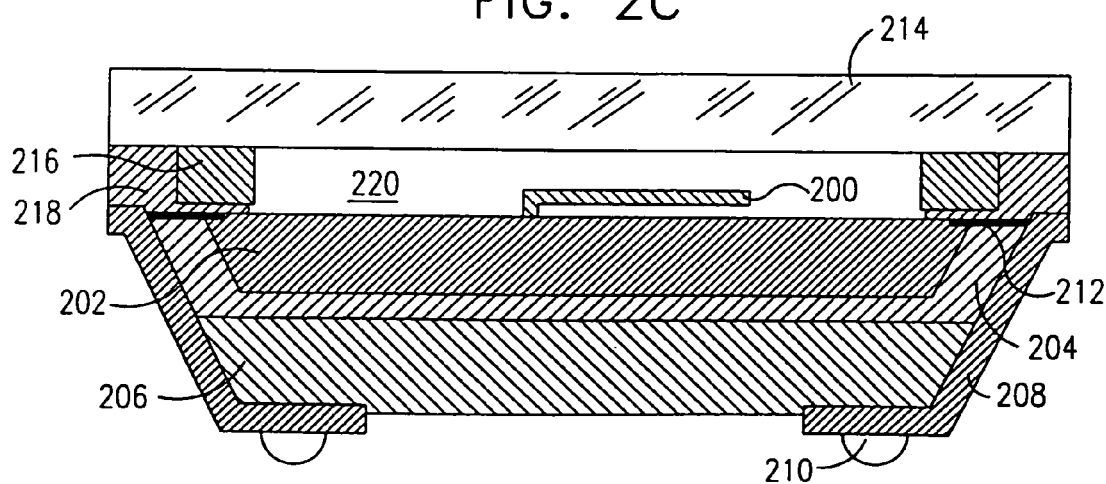

FIG. 2C shows an integrated circuit device including a optoelectronic or electromechanical device 200 formed on a crystalline substrate 202. Underlying the substrate 202 and sealed thereto by epoxy 204 is a packaging layer 206, typically formed of glass, along edges of which are formed electrical contacts 208, typically defining bumps 210. Conductive pads 212 preferably connect substrate 202 to electrical contacts 208.

In accordance with a preferred embodiment of the present invention a packaging layer 214, typically formed of glass, and associated spacer elements 216, are sealed, by means of an adhesive such as epoxy 218, over substrate 202 so as to define a cavity 220 between the device 200 and layer 214.

It is appreciated that packaging layer 214 is preferably transparent and may have formed thereon a dichroic filter and/or anti-reflective coating.

Figure 2D:
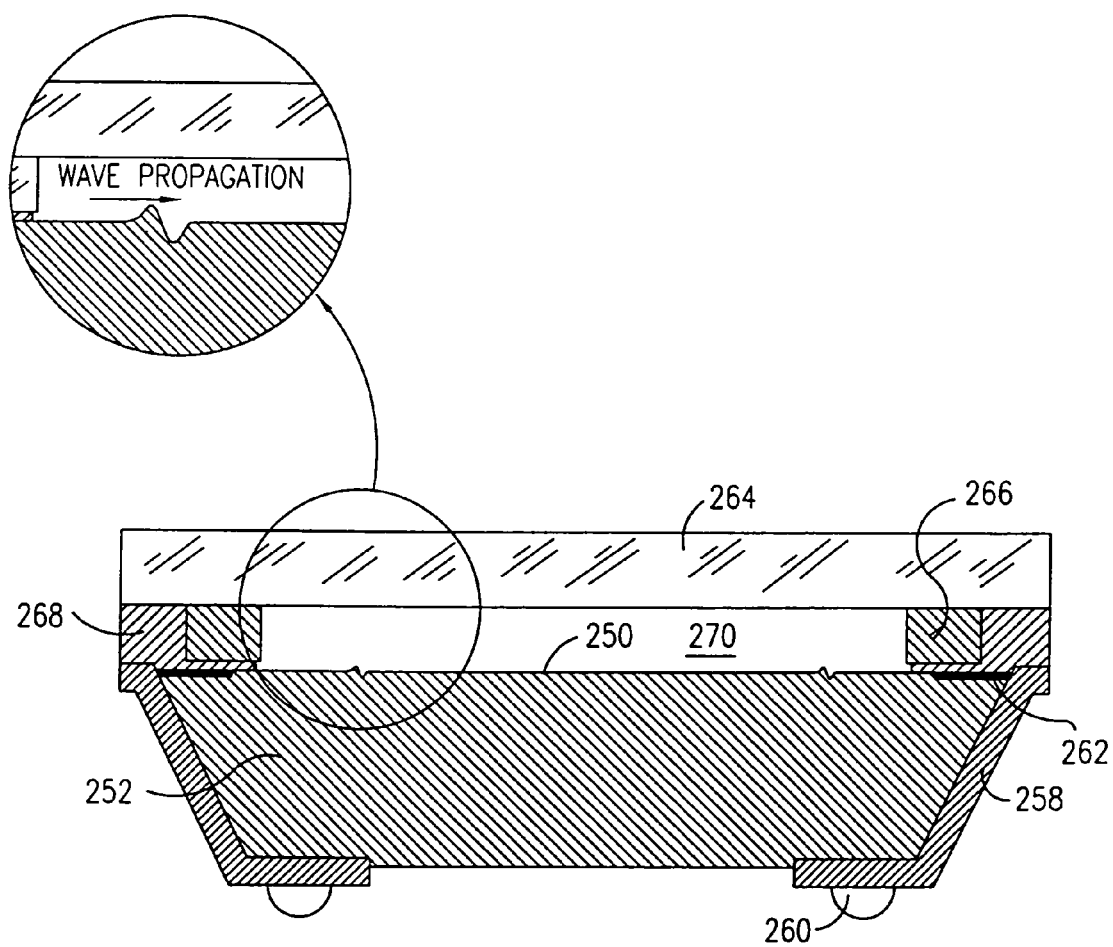

FIG. 2D shows a Surface Acoustic Wave (SAW) device including a SAW propagation surface 250 defined on a crystalline substrate 252, along edges of which are formed electrical contacts 258, typically defining bumps 260. Conductive pads 262 preferably connect substrate 252 to electrical contacts 258.

In accordance with a preferred embodiment of the present invention a packaging layer 264, typically formed of glass, and associated spacer elements 266, are sealed, by means of an adhesive such as epoxy 268, over substrate 252 so as to define a cavity 270 between surface 250 and layer 264.

Figure 3:
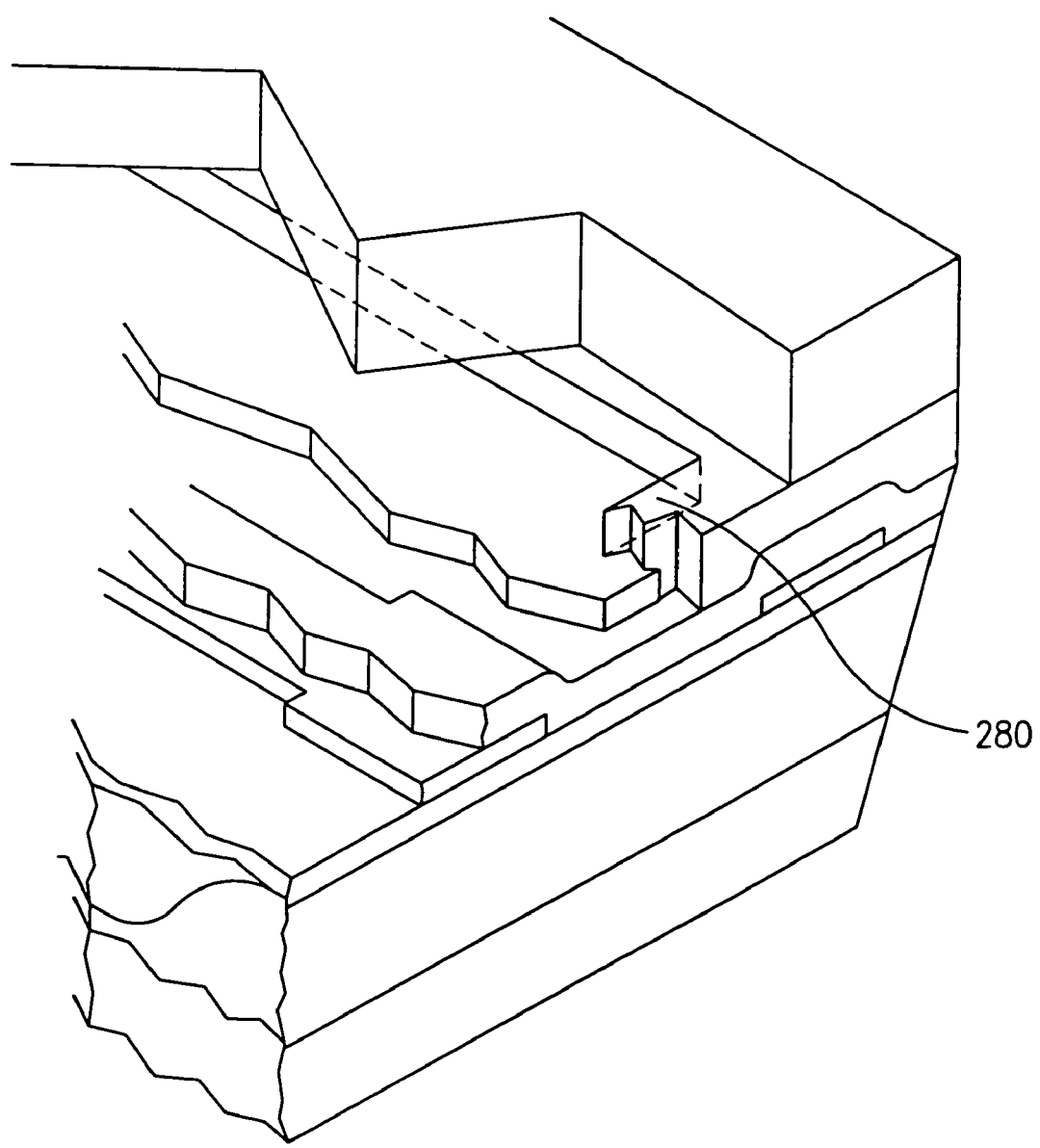
FIG. 3 is a partially cut-away sectional illustration of a crystalline substrate based device of the type shown in FIGS. 1A & 1B.

Reference is now made to FIG. 3, which is a partially cut away illustration of a typical integrated circuit device of the type shown in FIGS. 1A–2D, having a cavity as indicated by reference numeral 280.

Figure 4A:
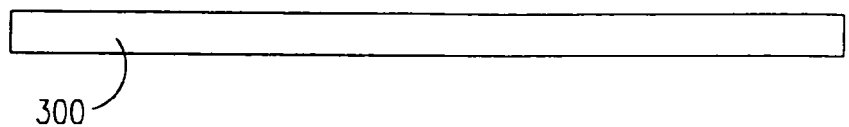
FIGS. 4A, 4B, 4C, 4D & 4E are simplified illustrations of steps in a method for producing a packaging layer for use in crystalline substrate based device in accordance with a preferred embodiment of the present invention.
Figure 4B:
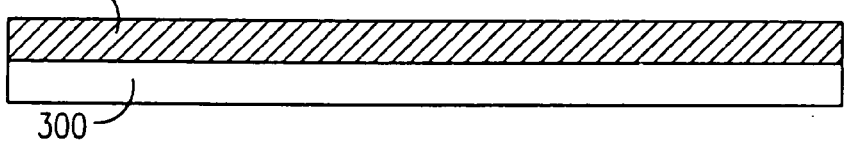

Reference is now made to FIGS. 4A, 4B, 4C, 4D & 4E, which are simplified illustrations of steps in a method for producing a packaging layer for use in crystalline substrate based device in accordance with a preferred embodiment of the present invention. As seen in FIGS. 4A & 4B, a substrate 300, typically formed of glass, is preferably coated with a layer 302 of epoxy based photoresist, typically SU-8 photoresist, commercially available from MicroChem Corp. of Newton, Mass., USA.

Figure 4C:
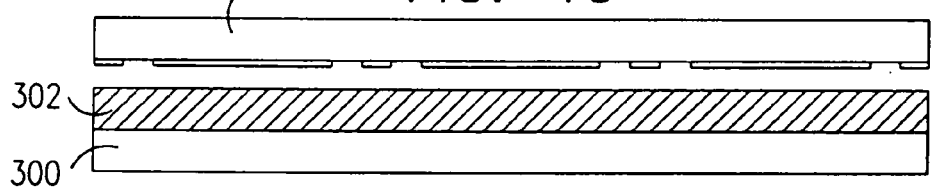
Figure 4D:
Figure 4E:
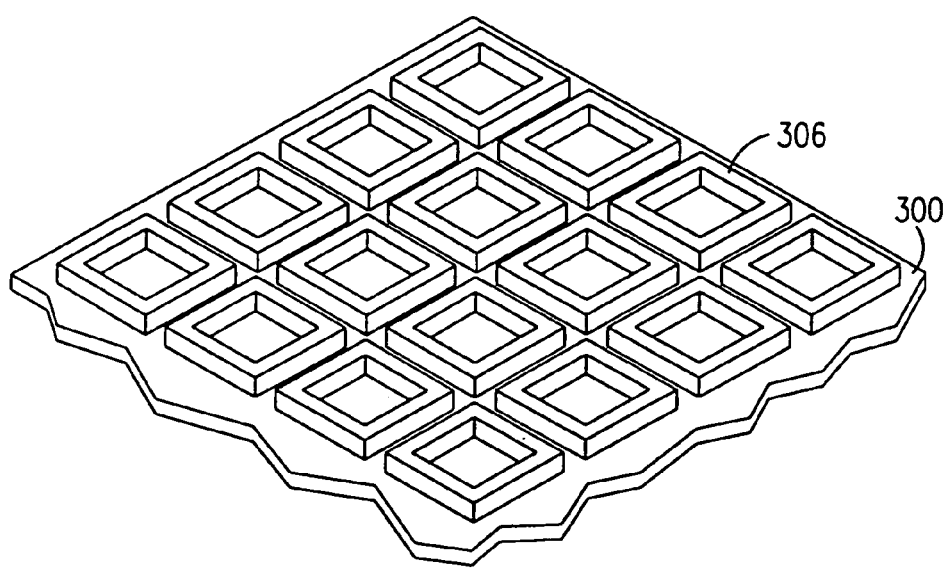

The photoresist layer 302 is exposed via a mask 304, as shown in FIG. 4C and washed to define spacers 306 shown in FIG. 4D, which are typically of rectangular configuration, as indicated in FIG. 4E. These spacers correspond to spacer elements 116, 166, 216 and 266 in FIGS. 2A–2D respectively.

Reference is now made to FIGS. 5A, 5B, 5C, 5D, 5E, 5F, 5G, 5H & 5I, which are simplified illustrations of steps in a method for producing a crystalline substrate based device of the type shown in FIGS. 2A & 2C in accordance with a preferred embodiment of the present invention.

Figure 5A:
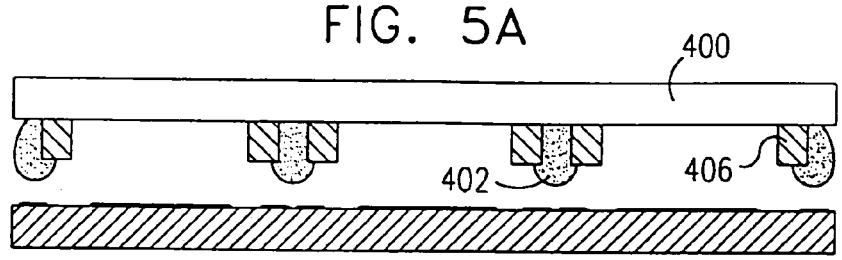
FIGS. 5A, 5B, 5C, 5D, 5E, 5F, 5G, 5H & 5I are simplified illustrations of steps in a method for producing a crystalline substrate based device of the type shown in FIGS. 2A & 2C in accordance with a preferred embodiment of the present invention.

As seen in FIG. 5A, a packaging layer 400, typically of the type shown in FIGS. 4D and 4E is provided. Adhesive 402 is applied thereto, preferably adjacent and between spacers 406 formed thereon, which correspond to the spacers 306 shown in FIGS. 4D & 4E respectively and also correspond to spacer elements 116, 166, 216 and 266 in FIGS. 2A–2D respectively. Adhesive 402 is preferably a high temperature epoxy, such as EPO-TEK 353ND, commercially available from Epoxy Technology Inc. of Billerica, Mass., USA.

Figure 5B:
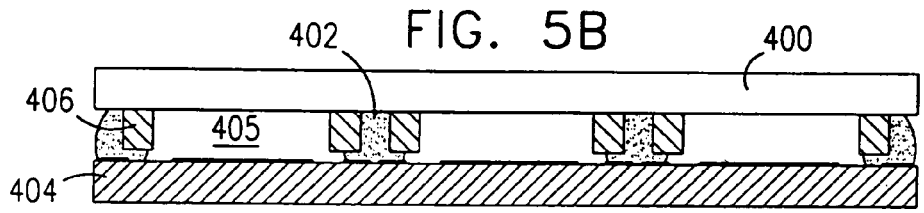

As shown in FIG. 5B, the packaging layer 400, thus prepared, is adhered to a crystalline substrate 404, typically having at least one metal layer thereon and having mounted thereon optomechanical or optoelectronic devices of the types described hereinabove with reference to FIGS. 2A & 2C. As seen clearly, a cavity 405 is defined between the packaging layer 400 and the substrate 404, in accordance with a preferred embodiment of the present invention.

Figure 5C:
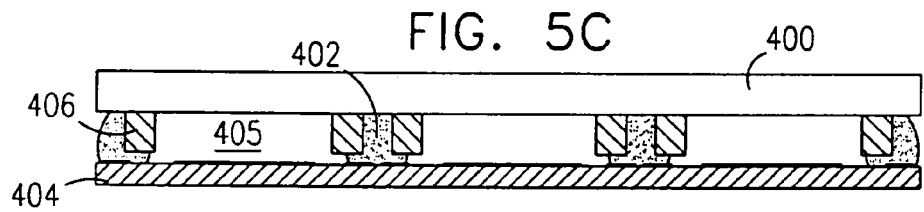
Figure 5D:
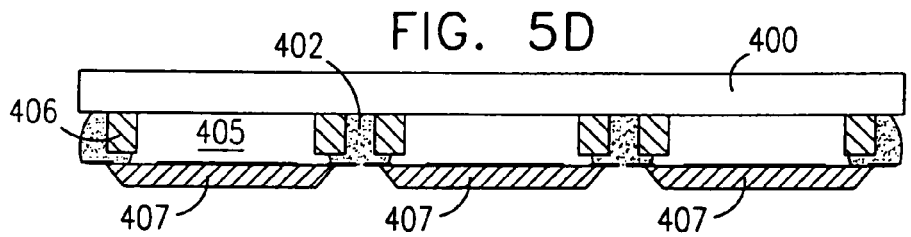
Figure 5E:
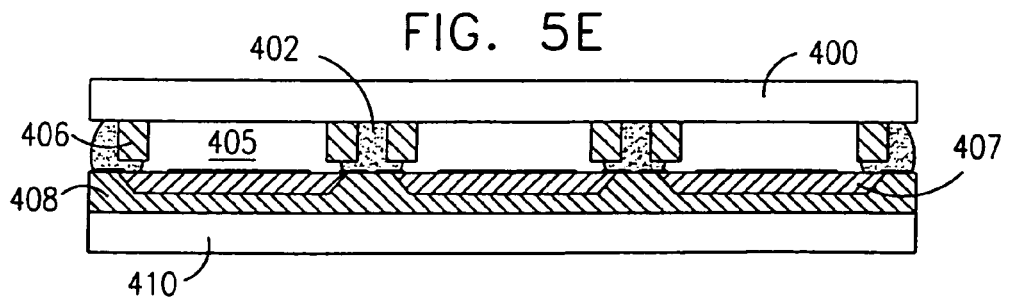

The crystalline substrate 404 is preferably lapped, as shown in FIG. 5C and etched, as shown in FIG. 5D, to define separate substrates 407. Following etching, the substrates 407 are adhered via an epoxy layer 408 to an underlying packaging layer 410, as shown in FIG. 5E.

Figure 5F:
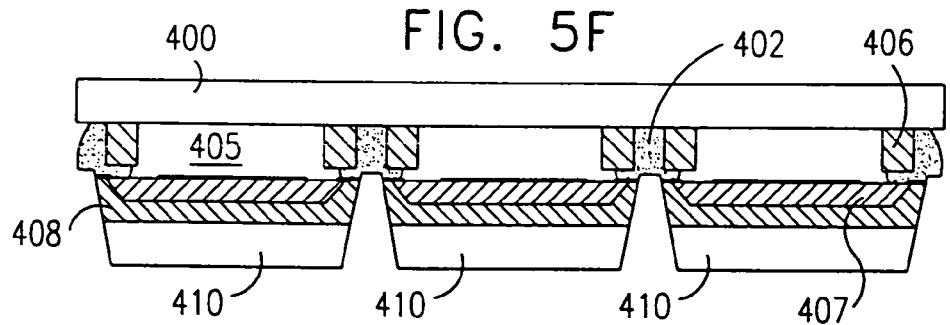
Figure 5G:
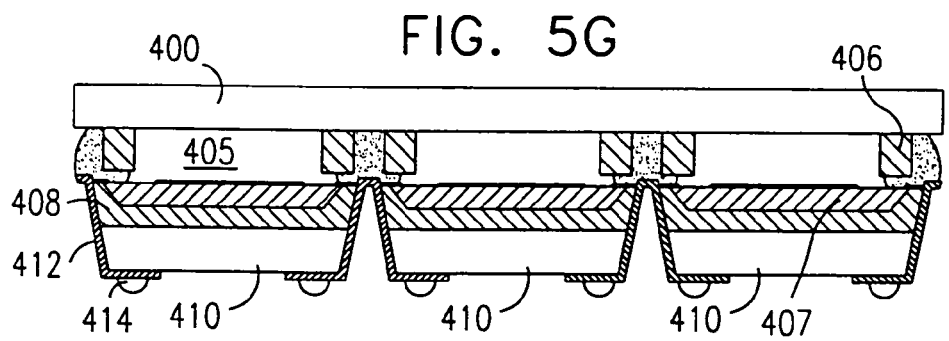
Figure 5H:
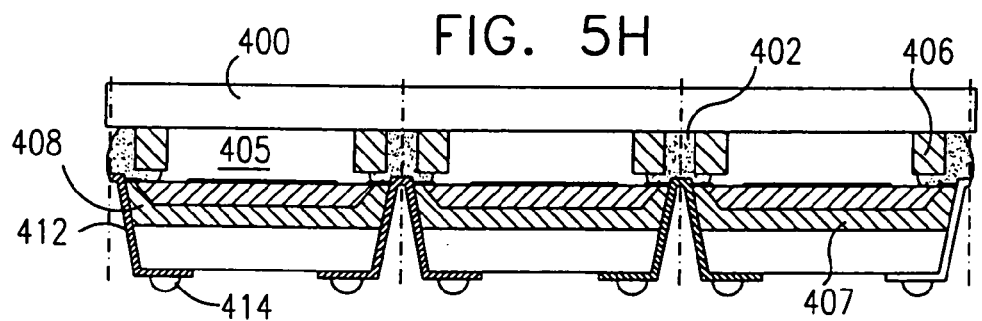
Figure 5I:
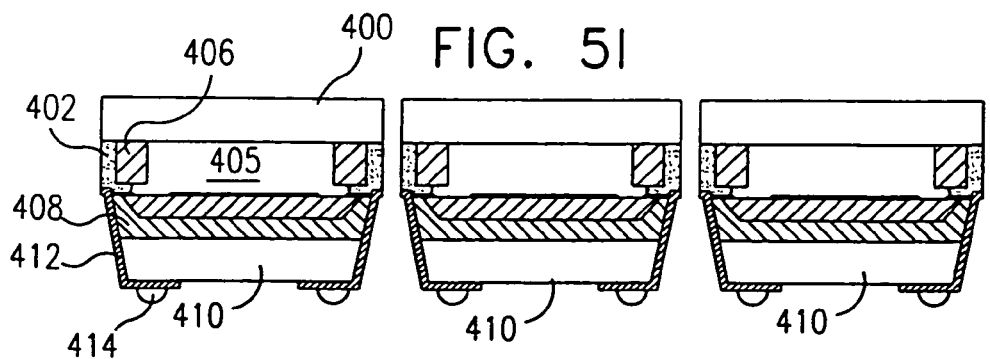

As seen in FIG. 5F, the packaging layer 410 and epoxy layer 408 are mechanically notched and thereafter electrical contacts 412 and typically bumps 414 are formed thereon, as seen in FIG. 5G. The resulting assembly is diced as shown in FIG. 5H to yield a plurality of packaged integrated circuit devices, as seen in FIG. 5I.

It is appreciated that here and throughout all of the examples described herein, the crystalline substrate may be any suitable crystalline substrate and may comprise, for example, silicon, lithium niobate, lithium tantalate or quartz.

The manufacturing techniques described hereinabove and hereinbelow may but need not necessarily include techniques described in any of the following U.S. Patents and patent applications of the present inventor/assignee, the disclosure of which is hereby incorporated by reference: U.S. Pat. Nos. 5,716,759; 5,547,906; 5,455,455 and Ser. No. 08/952,019.

Reference is now made to FIGS. 6A, 6B, 6C, 6D, 6E, 6F, 6G, 6H, 6I, 6J & 6K, which are simplified illustrations of steps in a method for producing a crystalline substrate based device of the type shown in FIG. 2B in accordance with another preferred embodiment of the present invention.

Figure 6A:
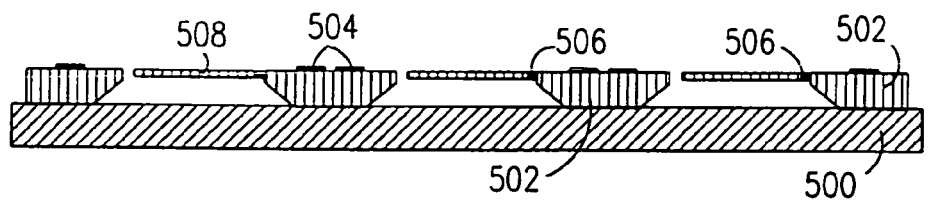
FIGS. 6A, 6B, 6C, 6D, 6E, 6F, 6G, 6H, 6I, 6J & 6K are simplified illustrations of steps in a method for producing a crystalline substrate based device of the type shown in FIG. 2B in accordance with another preferred embodiment of the present invention.

As seen in FIG. 6A, mounted on a substrate 500, typically formed of Pyrex are a plurality of crystalline substrates 502 onto which are formed pads 504 and onto which are suspended, as by electrically conductive connectors 506, optoelectronic or electromechanical devices 508, such as chemical sensors, micromirror arrays or an accelerometer, which may correspond to devices 150 of the type shown in FIG. 2B.

Figure 6B:
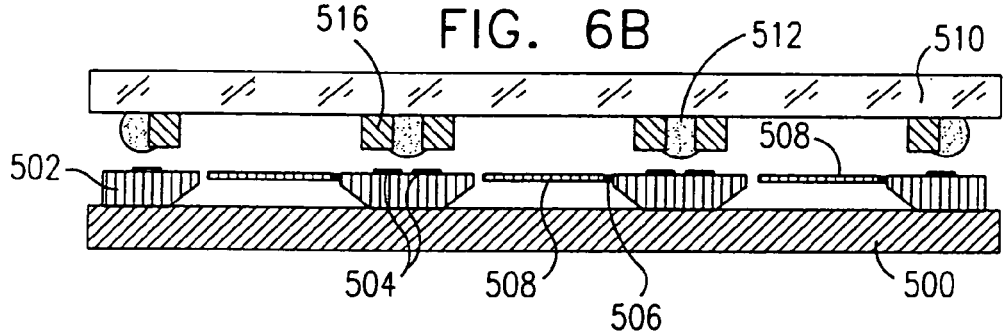

As shown in FIG. 6B, a packaging layer 510, typically of the type shown in FIGS. 4D and 4E, is provided having adhesive 512 applied thereto, preferably adjacent and between spacers 516 formed thereon, which correspond to the spacers 306 shown in FIGS. 4D & 4E respectively and also correspond to spacer elements 116, 166, 216 and 266 in FIGS. 2A–2D respectively. Adhesive 512 is preferably a high temperature epoxy, such as EPO-TEK 353ND, commercially available from Epoxy Technology Inc. of Billerica, Mass., USA.

Figure 6C:
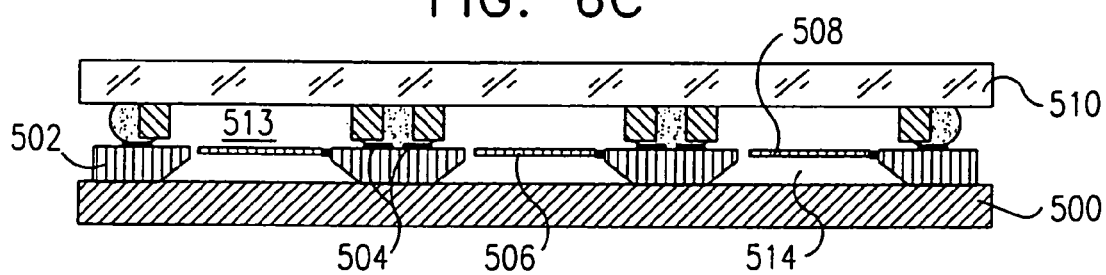

As seen in FIG. 6C, the packaging layer 510, thus prepared, is adhered to crystalline substrates 502, typically adjacent pads 504. As seen clearly, a cavity 513 is defined between the packaging layer 510 and the substrates 502, and another cavity 514 is defined between substrates 502, substrate 500 and electromechanical devices 508 in accordance with a preferred embodiment of the present invention.

Figure 6D:
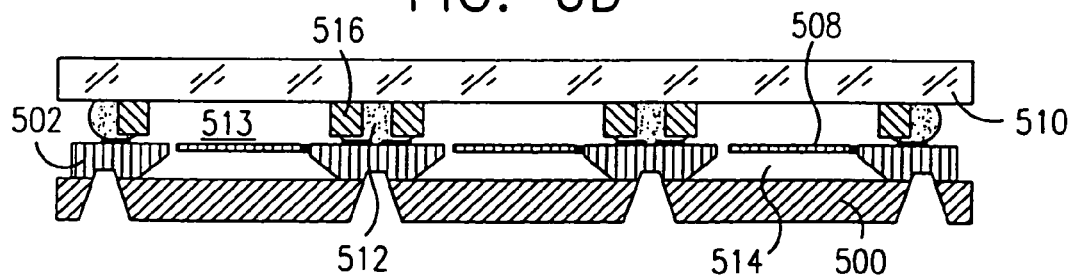
Figure 6E:
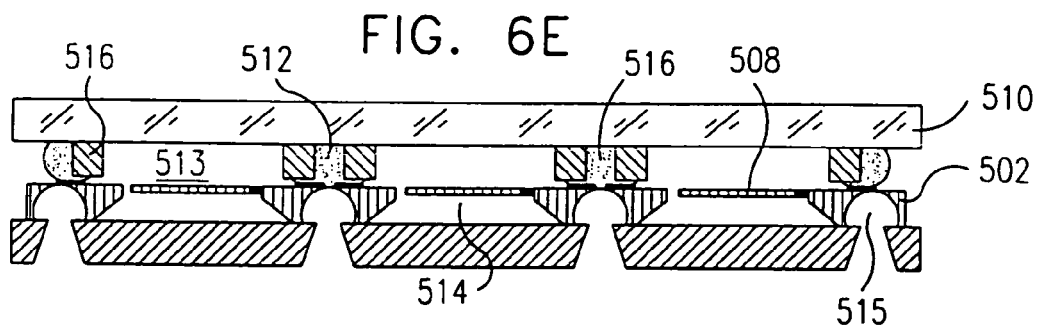
Figure 6F:
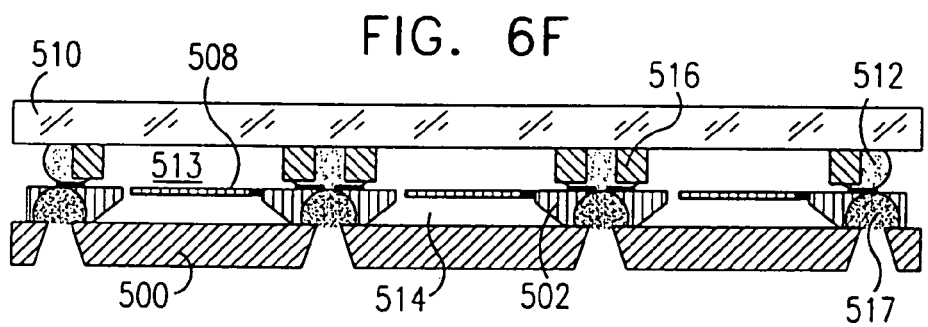

The substrate 500 and crystalline substrates 502 are preferably notched, as shown in FIG. 6D and etched, as shown in FIG. 6E, to define volumes 515 in crystalline substrates 502 which are preferably filled with epoxy 517, as shown in FIG. 6F.

Figure 6G:
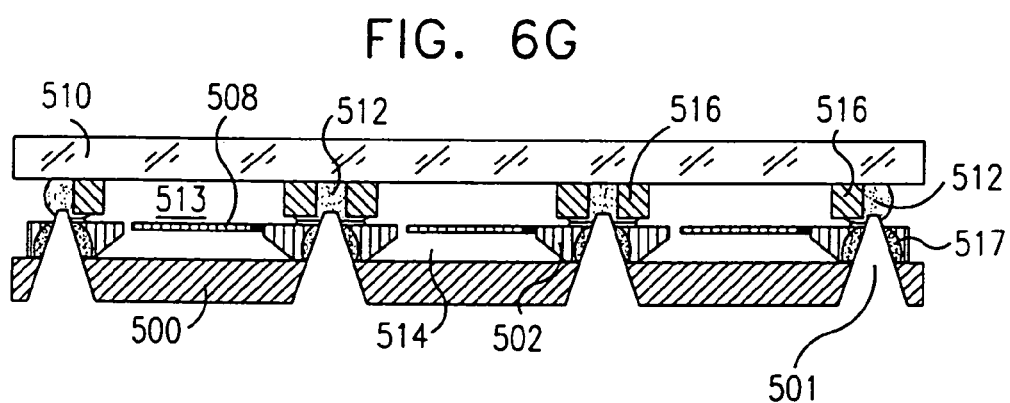
Figure 6H:
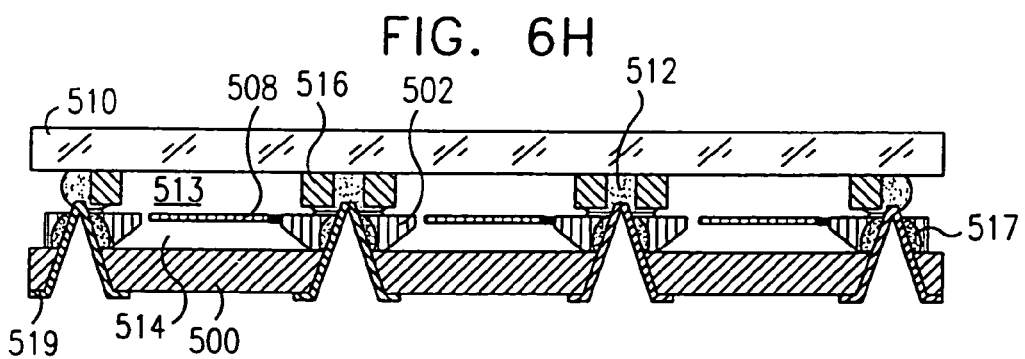
Figure 6I:
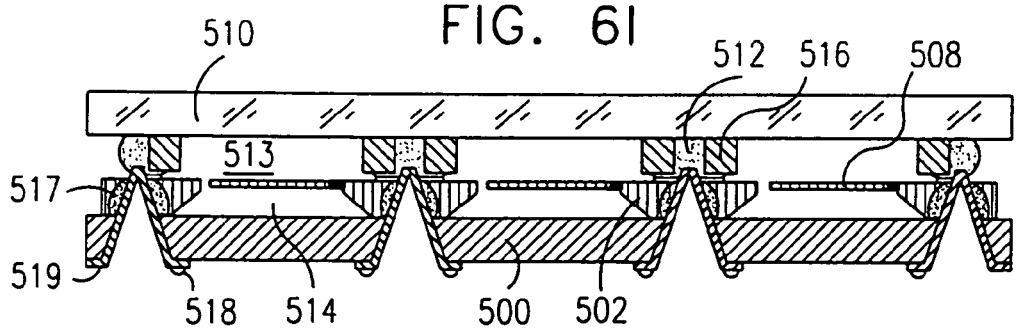
Figure 6J:
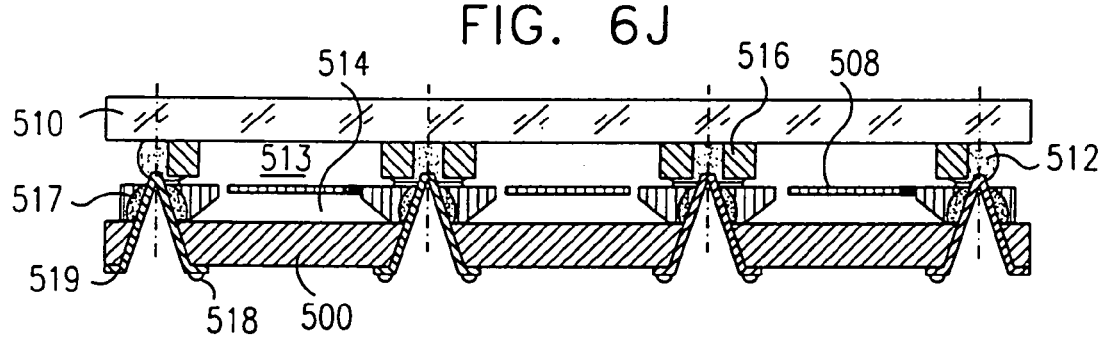
Figure 6K:
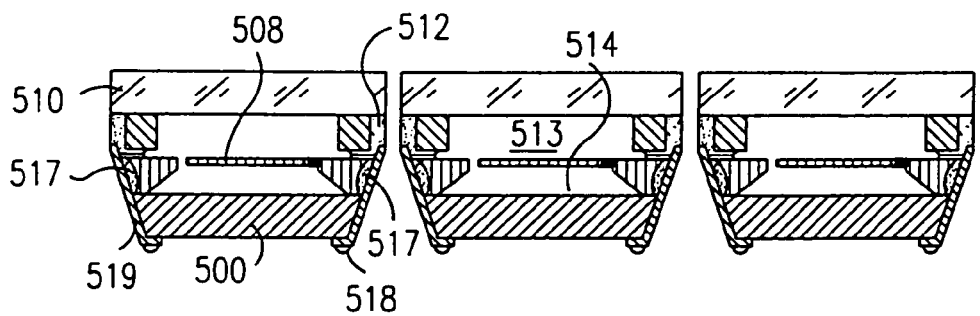

As seen in FIG. 6G, the substrate 500, the epoxy 516 and the adhesive 512 are then mechanically notched to form a notch 501, and thereafter electrical contacts 519 are formed thereon, as by sputtering, as shown in FIG. 6H. Bumps 518 are formed thereon, as seen in FIG. 6I, preferably together with a NiAu coating. The resulting assembly is diced as shown in FIG. 6J to yield a plurality of packaged integrated circuit devices, as seen in FIG. 6K.

Reference is now made to FIGS. 7A, 7B, 7C, 7D, 7E, 7F & 7G, which are simplified illustrations of steps in a method for producing a crystalline substrate based device of the type shown in FIG. 2D in accordance with another preferred embodiment of the present invention.

Figure 7A:
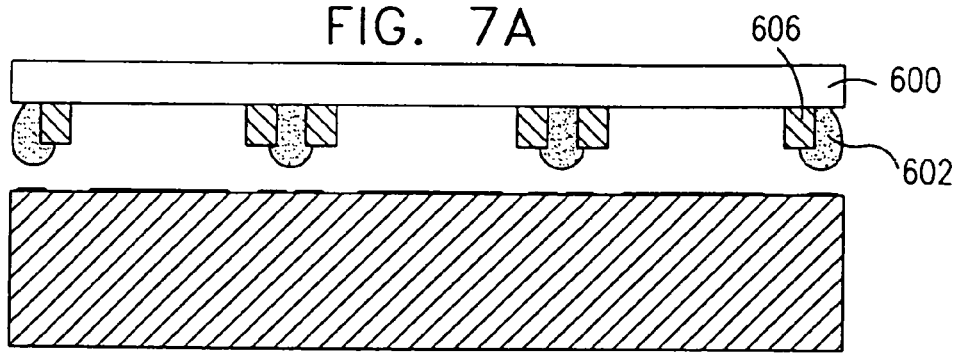
FIGS. 7A, 7B, 7C, 7D, 7E, 7F & 7G are simplified illustrations of steps in a method for producing a crystalline substrate based device of the type shown in FIG. 2D in accordance with another preferred embodiment of the present invention.

As seen in FIG. 7A, a packaging layer 600, typically of the type shown in FIGS. 4D and 4E is provided. Adhesive 602 is applied thereto, preferably adjacent and between spacers 606 formed thereon, which correspond to the spacers 306 shown in FIGS. 4D & 4E respectively and also correspond to spacer elements 116, 166, 216 and 266 in FIGS. 2A–2D respectively. Adhesive 602 is preferably a high temperature epoxy, such as EPO-TEK 353ND, commercially available from Epoxy Technology Inc. of Billerica, Mass., USA.

Figure 7B:
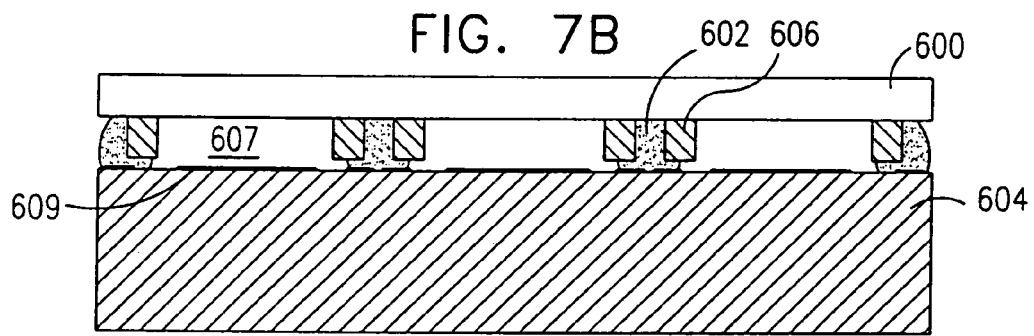

As shown in FIG. 7B, the packaging layer 600, thus prepared, is adhered to a crystalline substrate 604, typically having at least one metal layer thereon and having defined thereon a SAW propagation layer 609 as described hereinabove with reference to FIG. 2D. As seen clearly, a cavity 607 is defined between the packaging layer 600 and the SAW propagation layer 609, in accordance with a preferred embodiment of the present invention.

Figure 7C:
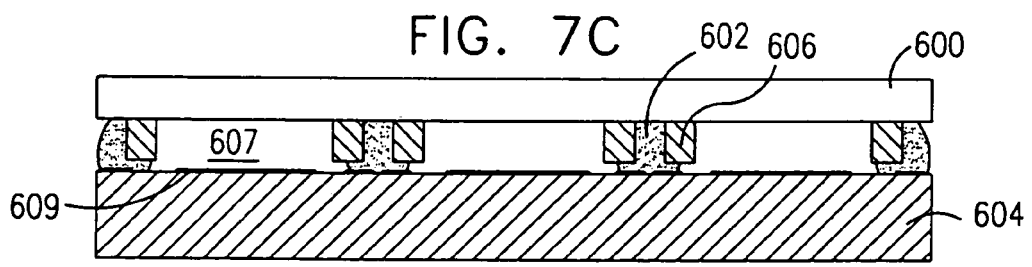
Figure 7D:
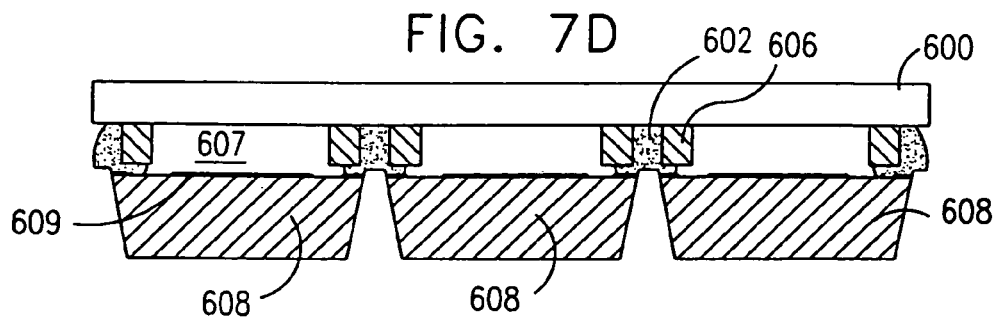
Figure 7E:
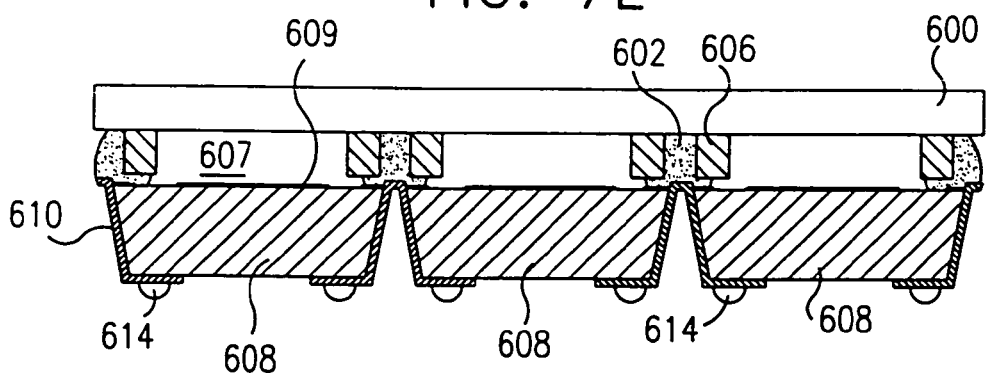
Figure 7F:
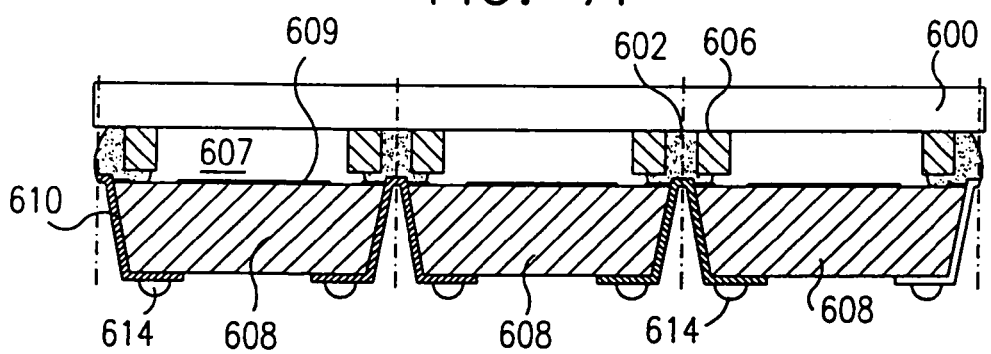
Figure 7G:
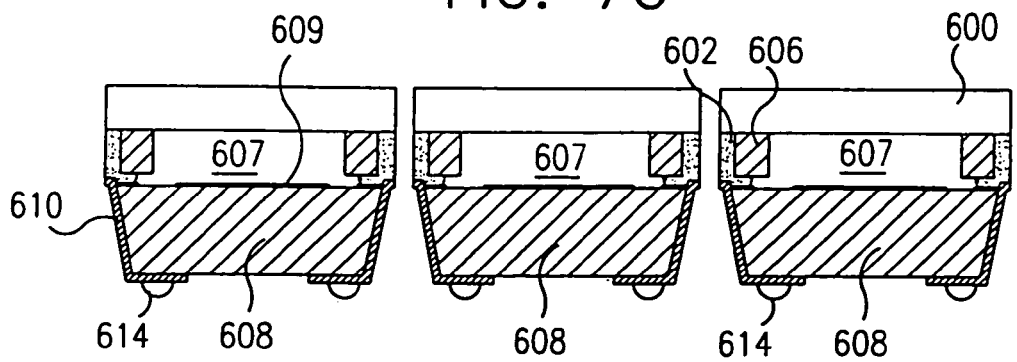

The crystalline substrate 604 can be lapped, as shown in FIG. 7C and notched partially into the adhesive 602, as shown in FIG. 7D, to define separate substrates 608. Following etching, electrical contacts 610 and typically bumps 614 are formed thereon, as seen in FIG. 7E. The resulting assembly is diced as shown in FIG. 7F to yield a plurality of packaged SAW devices, as seen in FIG. 7G.

Figure 8A:
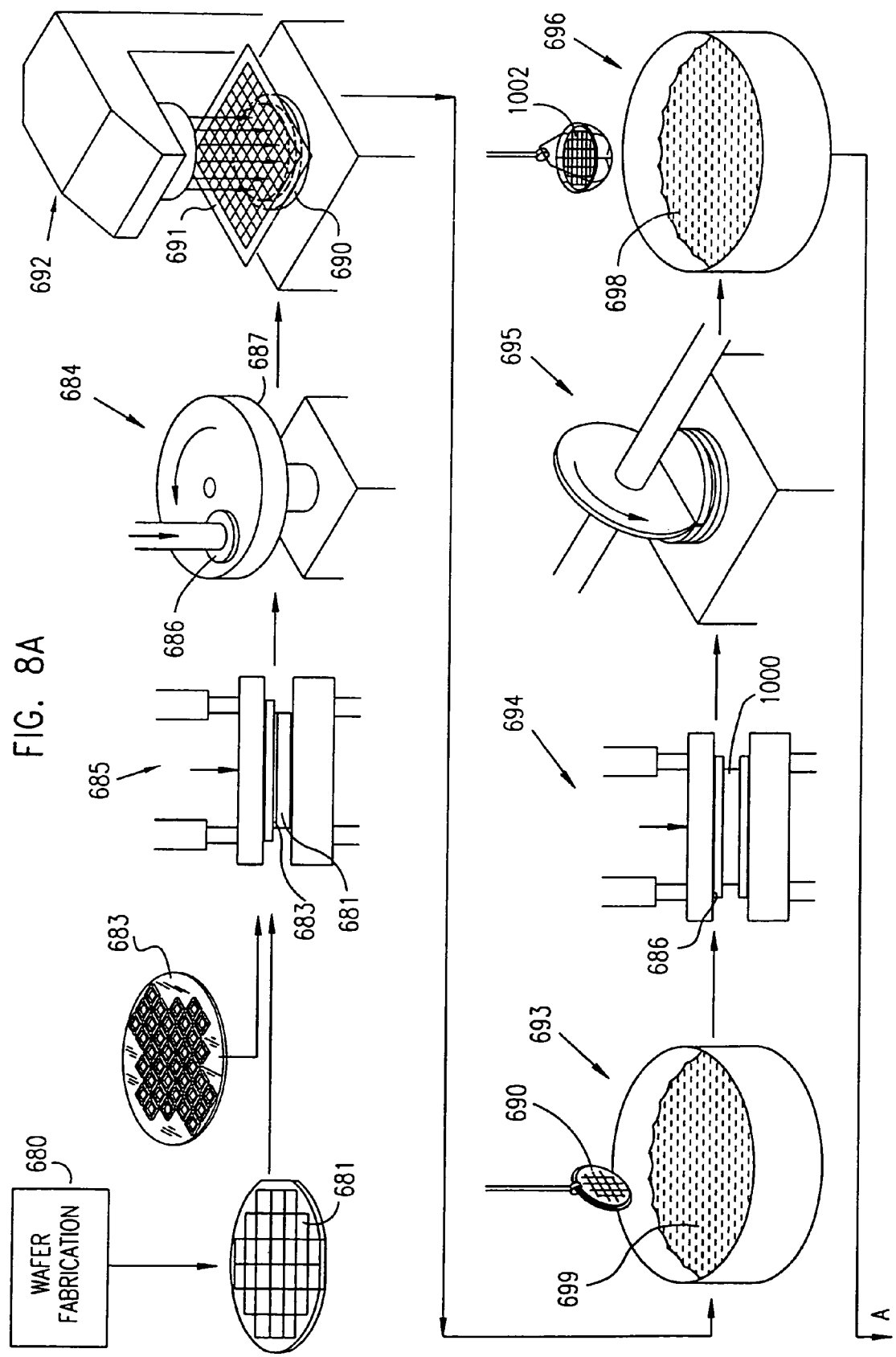
FIGS. 8A and 8B are illustrations of apparatus typically employed in the manufacture of a crystalline substrate based devices of the type shown in FIGS. 2A & 2C in the manner shown in FIGS. 5A–5I.
Figure 8B:
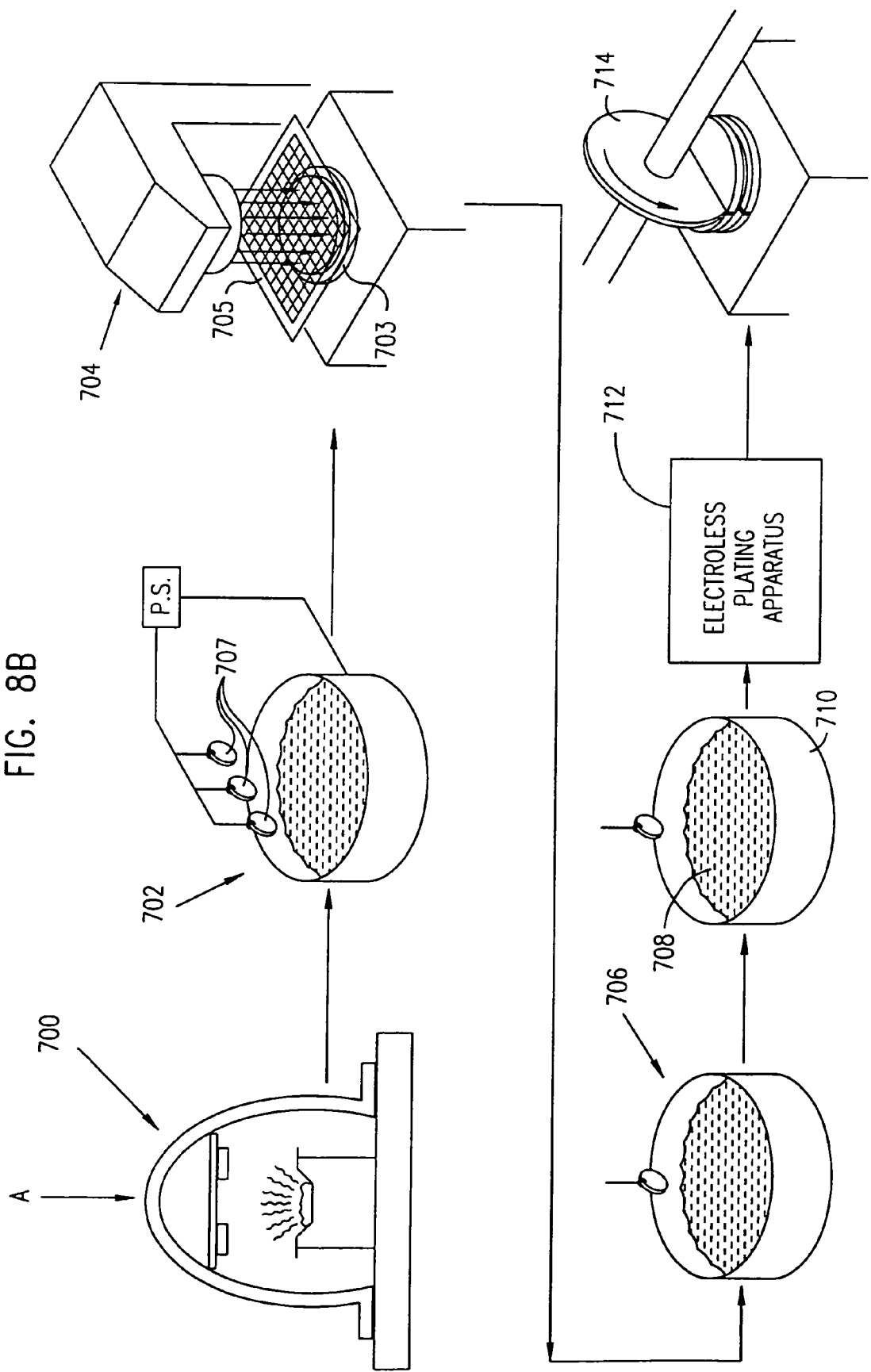

Reference is now made to FIGS. 8A and 8B, which are illustrations of apparatus employed in the manufacture of a crystalline substrate based devices of the type shown in FIGS. 2A & 2C in the manner shown in FIGS. 5A–5I. As seen in FIGS. 8A and 8B, a conventional wafer fabrication facility 680 provides complete wafers 681, of the type shown in FIG. 5A. Individual wafers 682 are bonded on their active surfaces to protective layers 683 as shown in FIGS. 5A & 5B, by bonding apparatus 685, preferably having facilities for rotation of the wafer 682, the layer 683 and the epoxy so as to obtain even distribution of the epoxy.

The bonded wafer 686 is thinned (FIG. 5C) at its non-active surface as by grinding apparatus 684, such as Model 32BTGW using 12.5A abrasive 687, which is commercially available from Speedfam Machines Co. Ltd. of England.

The wafer is then etched (FIG. 5D) at its non-active surface, preferably by photolithography, such as by using conventional spin-coated photoresist, which is commercially available from Hoechst, under the brand designation AZ 4562, using a mask exposure machine 692 for the exposure of light sensitive photoresist 690 through the mask 691 and later etching the silicon in a bath 693 using solution 699.

The etched wafer 1000 is bonded (FIG. 5E) on the non-active side to protective layer 686 by bonding apparatus 694, which may be essentially the same as apparatus 685, to produce a doubly bonded wafer sandwich.

Notching apparatus 695 partially cuts the bonded wafer sandwich of FIG. 5E to the configuration shown in FIG. 5F.

The notched wafer 1002 is then preferably subjected to anti-corrosion treatment in a bath 696, containing a chromating solution 698, such as described in any of the following U.S. Pat. Nos.: 2,507,956; 2,851,385 and 2,796,370, the disclosure of which is hereby incorporated by reference.

Conductive layer deposition apparatus 700, which operates by vacuum deposition techniques, such as a Model 903M sputtering machine manufactured by Material Research Corporation of the U.S.A., is employed to produce a conductive layer on one or more surfaces of each die of the wafer as shown in FIG. 5G.

Configuration of contact strips, as shown in FIG. 5G, is carried out preferably by using conventional electro-deposited photoresist 701, which is commercially available from DuPont under the brand name Primecoat or from Shipley, under the brand name Eagle. The photoresist 701 is applied to the wafers 707 in a photoresist bath assembly 702, which is commercially available from DuPont or Shipley.

The photoresist 703 is preferably light configured by a UV exposure system 704, which may be identical to system 692, using a mask 705 to define suitable etching patterns. The photoresist is then developed in a development bath 706, and then the wafer is etched in a metal etch solution 708 located in an etching bath 710, thus providing a conductor configuration such as that shown in FIG. 5G.

The exposed conductive strips shown in FIG. 5G are then plated, preferably by electroless plating apparatus 712, which is commercially available from Okuno of Japan.

The wafer is then diced (FIG. 5H) into individual prepackaged integrated circuit devices. Preferably the dicing blade 714 should be a diamond resinoid blade of thickness 4–12 mils. The resulting dies appear as illustrated generally in FIG. 5I.

Figure 9A:
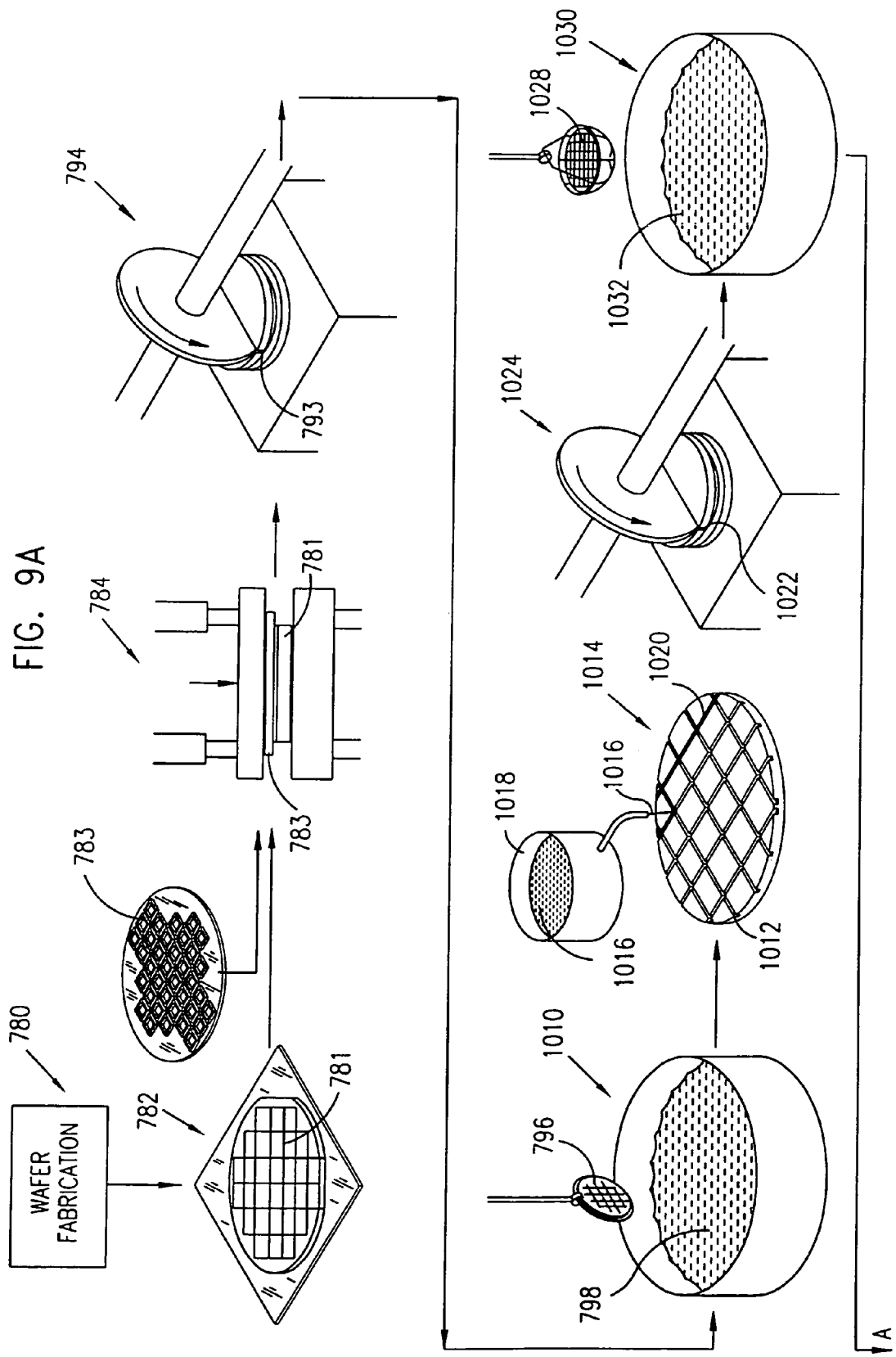

Reference is now made to FIGS. 9A and 9B, which are illustrations apparatus employed in the manufacture of a crystalline substrate based devices of the type shown in FIG. 2B in the manner shown in FIGS. 6A–6K. As seen in FIGS. 9A and 9B, a wafer fabrication facility 780 provides complete wafers 781, of the type shown in FIG. 6A mounted onto a substrate, such as a Pyrex substrate 782. Individual wafers 781 are bonded on their active surfaces to protective layers 783 as shown in FIGS. 6B & 6C, by bonding apparatus 784, preferably having facilities for rotation of the wafer 781, the layer 783 and the epoxy so as to obtain even distribution of the epoxy.

Notching apparatus 794 partially cuts the bonded wafer sandwich 793 of FIG. 6C to the configuration shown in FIG. 6D. The notched wafer 796 is then etched in a silicon etching solution 798 in a bath 1010. The etched voids 1012 in wafer 1014 are filled with epoxy 1016, using a dispenser 1018 to fill the voids 1012, to obtain epoxy filled voids 1020. The wafer 1022 is notched again using apparatus 1024 through the epoxy filled trenches 1020.

The notched wafer 1028 is then preferably subjected to anti-corrosion treatment in a bath 1030, containing a chromating solution 1032, such as described in any of the following U.S. Pat. Nos.: 2,507,956; 2,851,385 and 2,796,370, the disclosure of which is hereby incorporated by reference.

Conductive layer deposition apparatus 800, which operates by vacuum deposition techniques, such as a Model 903M sputtering machine manufactured by Material Research Corporation of the U.S.A., is employed to produce a conductive layer on one or more surfaces of each die of the wafer as shown in FIG. 6G.

Configuration of contact strips, as shown in FIG. 6E, is carried out preferably by using conventional electro-deposited photoresist 801, which is commercially available from DuPont under the brand name Primecoat or from Shipley, under the brand name Eagle. The photoresist is applied to the wafers 803 in a photoresist bath assembly 802, which is commercially available from DuPont or Shipley.

The photoresist 807 is preferably light configured by a UV exposure system 804 using a mask 805 to define suitable etching patterns. The photoresist is then developed in a development bath 806, and then etched in a metal etch solution 808 located in an etching bath 810, thus providing a conductor configuration such as that shown in FIG. 1B.

The exposed conductive strips shown in FIG. 6G are then plated, preferably by electroless plating apparatus 812, which is commercially available from Okuno of Japan.

The wafer is then diced (FIG. 6H) into individual prepackaged integrated circuit devices. Preferably the dicing blade 814 should be a diamond resinoid blade of thickness 4–12 mils. The resulting dies appear as illustrated generally in FIG. 6K.

Figure 10A:
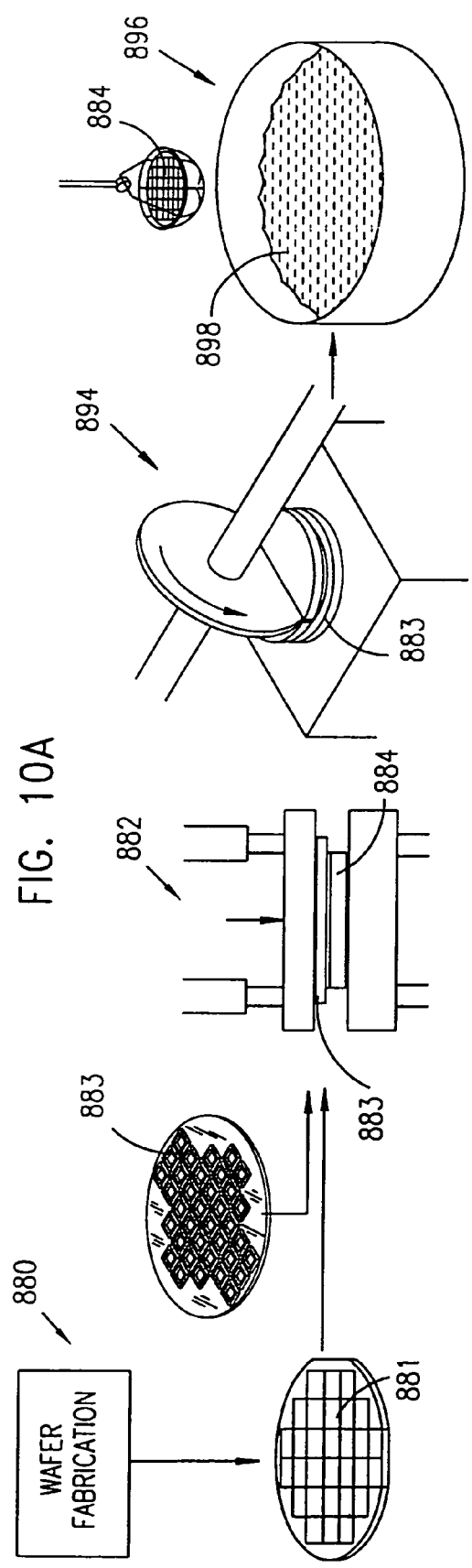
FIGS. 10A and 10B are illustrations of apparatus typically employed in the manufacture of a crystalline substrate based devices of the type shown in FIG. 2D in the manner shown in FIGS. 7A–7G.
Figure 10B:
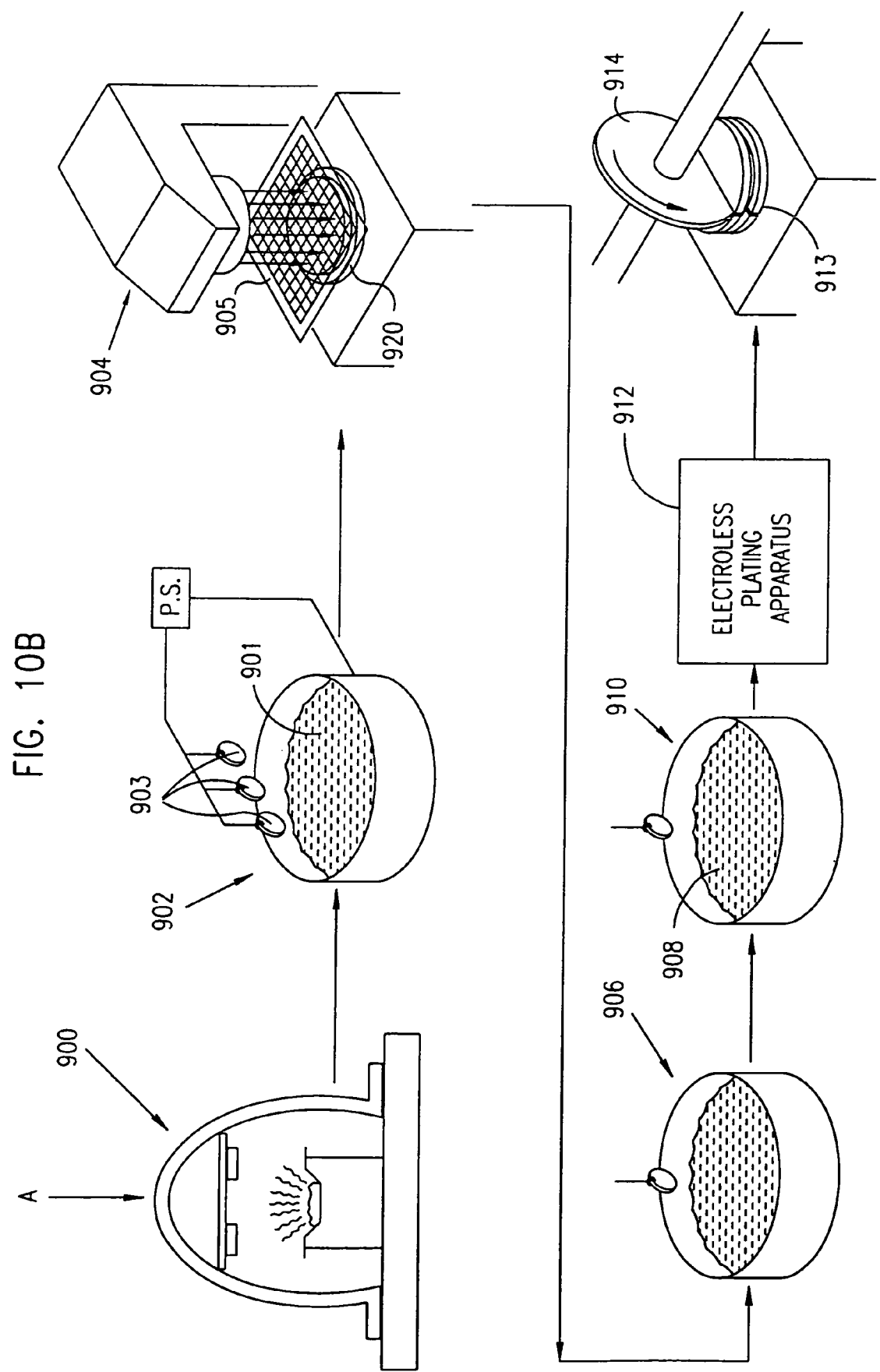

Reference is now made to FIGS. 10A and 10B, which are illustrations apparatus employed in the manufacture of a crystal line substrate based device of the type shown in FIG. 2D in the manner shown in FIGS. 7A–7G. As seen in FIGS. 10A and 10B, a conventional wafer fabrication facility 880 provides complete wafers 881, of the type shown in FIG. 7A. Individual wafers 881 are bonded on their active surfaces to protective layers 883 as shown in FIGS. 7A & 7B, by bonding apparatus 882, preferably having facilities for rotation of the wafer 881, the layer 883 and the epoxy so as to obtain even distribution of the epoxy.

Notching apparatus 894 partially cuts the wafer 883 of FIG. 7E to the configuration shown in FIG. 7F.

The notched wafer 884 is then preferably subjected to anti-corrosion treatment in a bath 896, containing a chromating solution 898, such as described in any of the following U.S. Pat. Nos.: 2,507,956; 2,851,385 and 2,796,370, the disclosure of which is hereby incorporated by reference.

Conductive layer deposition apparatus 900, which operates by vacuum deposition techniques, such as a Model 903M sputtering machine manufactured by Material Research Corporation of the U.S.A., is employed to produce a conductive layer on one or more surfaces of each die of the wafer as shown in FIG. 7G.

Configuration of contact strips, as shown in FIG. 7E, is carried out preferably by using conventional electro-deposited photoresist 901, which is commercially available from DuPont under the brand name Primecoat or from Shipley, under the brand name Eagle. The photoresist 901 is applied to the wafers 903 in a photoresist bath assembly 902, which is commercially available from DuPont or Shipley.

The photoresist 920 is preferably light configured by a UV exposure system 904 using a mask 905 to define suitable etching patterns. The photoresist is then developed in a development bath 906, and then etched in a metal etch solution 908 located in an etching bath 910, thus providing a conductor configuration such as that shown in FIG. 1B.

The exposed conductive strips shown in FIG. 7G are then plated, preferably by electroless plating apparatus 912, which is commercially available from Okuno of Japan.

The wafer 913 is then diced (FIG. 5H) into individual pre-packaged integrated circuit devices. Preferably the dicing blade 914 should be a diamond resinoid blade of thickness 4–12 mils. The resulting dies appear as illustrated generally in FIG. 7G.

It will be appreciated by persons skilled in the art that the present invention is not limited by what has been particularly shown and described hereinabove. Rather the scope of the present invention includes both combinations and subcombinations of various features described hereinabove as well as modifications and variations thereof which would occur to a person of skill in the art upon reading the foregoing description and referring to the drawings and which are not in the prior art.

What is claimed is:

1. A method of producing a crystalline substrate based device comprising:
   providing a wafer including a semiconductor substrate and comprising a plurality of semiconductor microstructures each including at least one optoelectronic device;
   providing a wafer-level transparent packaging layer;
   forming a wafer-level spacer onto said wafer-level transparent packaging layer, said packaging layer and said spacer defining a plurality of cavities extending entirely through said spacer, the step of forming the wafer-level spacer including applying a spacer material separate from the wafer-level transparent packaging layer to the wafer-level transparent packaging layer; then
   sealing said wafer-level spacer to said wafer so that the cavities in the wafer-level spacer extend between the wafer and the transparent packaging layer; and
   subsequently dicing said semiconductor substrate, having said wafer-level spacer and said wafer-level transparent packaging layer sealed thereunto, to form individual chip scale packaged devices each including a microstructure, a chip scale portion of said transparent packaging layer, and a cavity disposed between the microstructure and the portion of the transparent packaging layer,
   wherein the process is performed without removing material of the wafer-level transparent packaging layer prior to said dicing step.

2. A method of producing a crystalline substrate based device according to claim 1 and wherein said sealing comprises using epoxy to seal said wafer-level spacer onto said wafer.

3. A method of producing a crystalline substrate based device according to claim 1 and wherein said semiconductor substrate comprises silicon.

4. A method of producing a crystalline substrate based device according to claim 1 and wherein said sealing comprises using an adhesive separate from said wafer-level spacer to seal said wafer-level spacer onto said semiconductor substrate.

5. A method of producing a crystalline substrate based device according to claim 4 and wherein said adhesive comprises epoxy.

6. A method for producing a crystalline substrate based device according to claim 1 and wherein said semiconductor substrate comprises silicon.

7. A method of producing a crystalline substrate based device according to claim 1 further comprising the step of forming electrical contacts prior to completion of the dicing step so that the contacts extend away from the wafer scale transparent packaging layer and so that after completion of the dicing step the contacts extend along edge surfaces of the individual chip scale packaged devices.

8. A method according to claim 7 wherein said dicing step includes forming channels extending through said crystalline substrate.

9. A method according to claim 8 further comprising the steps of depositing a layer material in said channels, said step of forming contacts being performed so that said contacts extend on said layer material.

10. A method according to claim 9 further comprising the step of forming notches in said layer material within said channels so that surfaces of said layer material in said notches will constitute edge surfaces of the individual chip scale packaged devices upon completion of the dicing step, the step of forming the contacts including forming the contacts on surfaces of the layer material in the notches.

11. A method according to claim 10 further comprising the step of bonding an underlying packaging layer to a rear surface of the crystalline substrate facing away from said transparent packaging layer.

12. A method according to claim 9 wherein said layer material is an epoxy.

13. A method of producing a crystalline substrate based device according to claim 1 wherein said step of forming the wafer level spacer includes applying a layer of the spacer material and selectively exposing the layer of spacer material to illumination so as to form the spacer from the layer of spacer material in a pattern defined by the selective illumination.

14. A method according to claim 13 wherein said spacer material is an epoxy photoresist.

15. A method according to claim 1 wherein said step of forming said wafer-level spacer includes forming the wafer-level spacer as an array of separate spacer elements on said wafer-level transparent packaging element.

16. A method according to claim 15 wherein said array of spacer elements includes pairs of spacer elements extending next to one another but separated from one another to define openings between them, wherein the sealing step is performed so as to position the spacer elements of each pair on mutually-adjacent ones of the microstructures in the wafer, and wherein the dicing step is performed so that the transparent wafer-level packaging element is cut in alignment with the openings.

17. A method according to claim16, wherein the sealing step includes applying an adhesive so that the adhesive extends into the openings, and wherein the dicing step includes dicing the adhesive in the openings.

18. A method according to claim 1 wherein each said optoelectronic device includes an array of microlenses, and wherein the sealing step is performed so that each array of microlenses is disposed within one of the cavities in the wafer-level spacer.

19. A method of making a plurality of chip scale packages comprising:
   (a) uniting a unitary semiconductor wafer including a plurality of chips, a wafer level protective layer and a plurality of spacer elements so that the spacer elements are disposed between the wafer level protective layer and the wafer, so that each spacer element is disposed on one chip and defines a cavity between that chip and the wafer level protective layer, and so that there are openings between spacer elements disposed on adjacent chips, the uniting step including connecting the spacer elements to the wafer using an adhesive so that the adhesive extends into the openings; and then (b) dicing the wafer and wafer level protective layer along severance planes aligned with the openings and extending through the adhesive.

20. A method as claimed in claim 19 wherein said uniting step includes providing the spacer elements and the wafer level protective layer as a unit and assembling the unit with the wafer.

21. A method as claimed in claim 19 wherein the spacer elements are rectangular.

22. A method of making a chip scale package comprising:
(a) forming a wafer level spacer on a wafer level protective layer by applying a layer of a spacer material onto the wafer level protective layer, selectively exposing the layer of spacer material to illumination so as to form the spacer from the layer of spacer material in a pattern defined by the selective illumination; and then
(b) assembling the wafer level protective layer and wafer level spacer with a semiconductor wafer including a plurality of chips and bonding the wafer level spacer to the semiconductor wafer; and then
(c) dicing the wafer and wafer level protective layer.

23. A method according to claim 22 wherein said spacer material is an epoxy photoresist.

24. A method according to claim 22 wherein the step of bonding the wafer level spacer to the wafer includes providing an adhesive separate from the wafer level spacer between the wafer level spacer and the semiconductor wafer.

25. A method of producing a crystalline substrate based device comprising:
providing a wafer including a semiconductor substrate and comprising a plurality of semiconductor microstructures each including at least one optoelectronic image sensor;
providing a wafer-level transparent packaging layer;
forming a wafer-level spacer onto said wafer-level transparent packaging layer, said packaging layer and said spacer defining a plurality of cavities extending entirely through said spacer, the step of forming the wafer-level spacer including applying a spacer material separate from the wafer-level transparent packaging layer to the wafer-level transparent packaging layer; then
sealing said wafer-level spacer to said wafer so that the cavities in the wafer-level spacer extend between the wafer and the transparent packaging layer; and
subsequently dicing said semiconductor substrate, having said wafer-level spacer and said wafer-level transparent packaging layer sealed thereunto, to form individual chip scale packaged devices each including a microstructure, a chip scale portion of said transparent packaging layer, and a cavity disposed between the microstructure and the portion of the transparent packaging layer,
wherein the process is performed without removing material from portions of the wafer-level transparent packaging layer overlying the image sensor prior to said dicing step.

26. A method of producing a crystalline substrate based device according to claim 25 and wherein said sealing comprises using epoxy to seal said wafer-level spacer onto said wafer.

27. A method of producing a crystalline substrate based device according to claim 25 and wherein said semiconductor substrate comprises silicon.

28. A method of producing a crystalline substrate based device according to claim 25 and wherein said sealing comprises using an adhesive separate from said wafer-level spacer to seal said wafer-level spacer onto said semiconductor substrate.

29. A method of producing a crystalline substrate based device according to claim 28 and wherein said adhesive comprises epoxy.

30. A method for producing a crystalline substrate based device according to claim 25 and wherein said semiconductor substrate comprises silicon.

31. A method of producing a crystalline substrate based device according to claim 25 further comprising the step of forming electrical contacts prior to completion of the dicing step so that the contacts extend away from the wafer scale transparent packaging layer and so that after completion of the dicing step the contacts extend along edge surfaces of the individual chip scale packaged devices.

32. A method according to claim 31 wherein said dicing step includes forming channels extending through said crystalline substrate.

33. A method according to claim 32 further comprising the steps of depositing a layer material in said channels, said step of forming contacts being performed so that said contacts extend on said layer material.

34. A method according to claim 33 further comprising the step of forming notches in said layer material within said channels so that surfaces of said layer material in said notches will constitute edge surfaces of the individual chip scale packaged devices upon completion of the dicing step, the step of forming the contacts including forming the contacts on surfaces of the layer material in the notches.

35. A method according to claim 34 further comprising the step of bonding an underlying packaging layer to a rear surface of the crystalline substrate facing away from said transparent packaging layer.

36. A method according to claim 34 wherein said layer material is an epoxy.

37. A method of producing a crystalline substrate based device according to claim 25 wherein said step of forming the wafer level spacer includes applying a layer of the spacer material and selectively exposing the layer of spacer material to illumination so as to form the spacer from the layer of spacer material in a pattern defined by the selective illumination.

38. A method according to claim 37 wherein said spacer material is an epoxy photoresist.

39. A method according to claim 25 wherein said step of forming said wafer-level spacer includes forming the wafer-level spacer as an array of separate spacer elements on said wafer-level transparent packaging element.

40. A method according to claim 39 wherein said array of spacer elements includes pairs of spacer elements extending next to one another but separated from one another to define openings between them, wherein the sealing step is performed so as to position the spacer elements of each pair on mutually-adjacent ones of the microstructures in the wafer, and wherein the dicing step is performed so that the transparent wafer-level packaging element is cut in alignment with the openings.

41. A method according to claim 40 wherein the sealing step includes applying an adhesive so that the adhesive extends into the openings, and wherein the dicing step includes dicing the adhesive in the openings.

42. A method according to claim 25 wherein each said optoelectronic image sensor includes an array of microlenses, and wherein the sealing step is performed so that each array of microlenses is disposed within one of the cavities in the wafer-level spacer.

* * * * *

UNITED STATES PATENT AND TRADEMARK OFFICE
CERTIFICATE OF CORRECTION

PATENT NO.         : 7,144,745 B2                                           Page 1 of 1
APPLICATION NO. : 09/922770
DATED                : December 5, 2006
INVENTOR(S)       : Avner Pierre Badehi It is certified that error appears in the above-identified patent and that said Letters Patent is hereby corrected as shown below:

Column 4, line 17, "device including a" should read -- device including an --.
Column 7, line 14, "disclosure of which is" should read -- disclosures of which are --.
Column 7, line 46, "manufacture of a" should read -- manufacture of --.
Column 8, line 2, "disclosure of which is" should read -- disclosures of which are --.
Column 8, line 48, "disclosure of which is" should read -- disclosures of which are --.
Column 10, line 8, "steps of depositing" should read -- step of depositing --.
Column 12, line 19, "steps of depositing" should read -- step of depositing --.

Signed and Sealed this

Twenty-seventh Day of November, 2007

JON W. DUDAS
*Director of the United States Patent and Trademark Office*

Disclaimer 7,144,745—Avner Pierre Badehi, Harei Yehuda (IL). METHODS FOR PRODUCING PACKAGED INTEGRATED CIRCUIT DEVICES AND PACKAGED INTEGRATED CIRCUIT DEVICES PRODUCED. Patent dated December 5, 2006. Disclaimer filed December 26, 2006, by the inventor.

Hereby disclaim the following complete claims in the above identified patent claim (6).

*(Official Gazette September 30, 2008)*